(12) United States Patent
Herbsommer et al.

(10) Patent No.: US 9,312,591 B2
(45) Date of Patent: Apr. 12, 2016

(54) DIELECTRIC WAVEGUIDE WITH CORNER SHIELDING

(71) Applicant: Texas Instruments Incorporated, Dallas, TX (US)

(72) Inventors: Juan Alejandro Herbsommer, Allen, TX (US); Gerd Schuppener, Allen, TX (US); Robert Floyd Payne, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 142 days.

(21) Appl. No.: 13/854,951

(22) Filed: Apr. 1, 2013

(65) Prior Publication Data

US 2014/0285292 A1    Sep. 25, 2014

Related U.S. Application Data

(60) Provisional application No. 61/803,435, filed on Mar. 19, 2013.

(51) Int. Cl.
*H01P 1/04* (2006.01)
*H01P 3/16* (2006.01)
*H01P 5/08* (2006.01)
(Continued)

(52) U.S. Cl.
CPC .............. *H01P 3/165* (2013.01); *G02B 6/4416* (2013.01); *H01P 3/121* (2013.01); *H01P 3/16* (2013.01); *H01P 5/00* (2013.01); *H01P 5/087* (2013.01); *H01P 5/107* (2013.01); *H01P 11/001* (2013.01); *H01P 11/002* (2013.01); *H01Q 1/50* (2013.01); *H01Q 19/108* (2013.01); *H01Q 19/30* (2013.01); *H04B 1/40* (2013.01); *Y10T 29/49016* (2015.01); *Y10T 29/49826* (2015.01)

(58) Field of Classification Search
CPC ........... H01P 1/042; H01P 5/082; H01P 1/04; H05K 1/0237; H05K 1/0243
USPC ................................. 333/248, 254–257, 260
See application file for complete search history.

(56) References Cited

U.S. PATENT DOCUMENTS 2,979,676 A    10/1957   Rueger et al.
3,275,956 A    9/1966    Prache
(Continued)

FOREIGN PATENT DOCUMENTS

EP    2267832 A1    10/2010
GB    2082845 A     3/1982
(Continued)

OTHER PUBLICATIONS

Magnus Rimskog and Tomas Bauer, High Density Through Silicon Via (TSV), Design, Test, Integration and Packaging of MEMS/MOEMS, Apr. 9-11, 2008, pp. 105-108.
(Continued)

*Primary Examiner* — Diana J Cheng
(74) *Attorney, Agent, or Firm* — Lawrence J. Bassuk; Frank D. Cimino

(57) ABSTRACT

A dielectric wave guide (DWG) has a longitudinal dielectric core member. The core member has a first dielectric constant value. A cladding surrounds the dielectric core member and has a second dielectric constant value that is lower than the first dielectric constant. A portion of the DWG is configured as a corner having a radius. A conductive layer formed on an outer radius of the corner.

2 Claims, 30 Drawing Sheets

(51) Int. Cl.

| | |
|---|---|
| *G02B 6/44* | (2006.01) |
| *H01P 11/00* | (2006.01) |
| *H01P 5/00* | (2006.01) |
| *H01Q 1/50* | (2006.01) |
| *H01Q 19/10* | (2006.01) |
| *H04B 1/40* | (2015.01) |
| *H01Q 19/30* | (2006.01) |
| *H01P 3/12* | (2006.01) |
| *H01P 5/107* | (2006.01) |

(56) References Cited

U.S. PATENT DOCUMENTS

| | | | |
|---|---|---|---|
| 4,550,976 A | | 11/1985 | Cooper et al. |
| 4,800,350 A | * | 1/1989 | Bridges et al. ............... 333/239 |
| 4,843,353 A | | 6/1989 | Sequeira |
| 5,258,730 A | | 11/1993 | Stern et al. |
| 6,268,781 B1 | | 7/2001 | Schaffner |
| 2008/0031583 A1 | | 2/2008 | Ohtsu et al. |
| 2010/0022195 A1 | | 1/2010 | Rofougaran |
| 2010/0113942 A1 | * | 5/2010 | Eberle ........................... 600/478 |
| 2011/0115579 A1 | | 5/2011 | Rofougaran |
| 2011/0286703 A1 | | 11/2011 | Kishima et al. |
| 2013/0016022 A1 | * | 1/2013 | Heiks et al. ................... 343/791 |
| 2013/0265734 A1 | * | 10/2013 | Herbsommer et al. ....... 361/783 |

FOREIGN PATENT DOCUMENTS

| | | | |
|---|---|---|---|
| JP | 5875301 | A | 5/1983 |
| JP | 2004317737 | A | 11/2004 |
| JP | 2011024176 | A | 2/2011 |
| RU | 2351043 | C2 | 3/2009 |
| RU | 124844 | U1 | 7/2011 |
| SU | 307450 | A | 6/1971 |
| SU | 1524116 | A1 | 11/1989 |
| SU | 1525780 | A1 | 11/1989 |
| WO | 2005083832 | A1 | 9/2005 |
| WO | 2012175397 | A1 | 12/2012 |

OTHER PUBLICATIONS

Kenichi Kawasaki et al, "A Millimeter-Wave Intra-Connect Solution", IEEE Journal of Solid-State Circuits, vol. 45, No. 12, Dec. 2010, pp. 2655-2666.

"RO3000 Series Circuit Materials, RO3003, RO3006 and RO3010 High Frequency Laminates", Data Sheet, Rogers Corporation, Revised Nov. 2011, pp. 1-4.

Constantine A. Balanis, "Antenna Theory: Analysis and Design, 2nd Edition", John Wiley & Sons, Inc., May 29,1996 pp. 513-532.

* cited by examiner

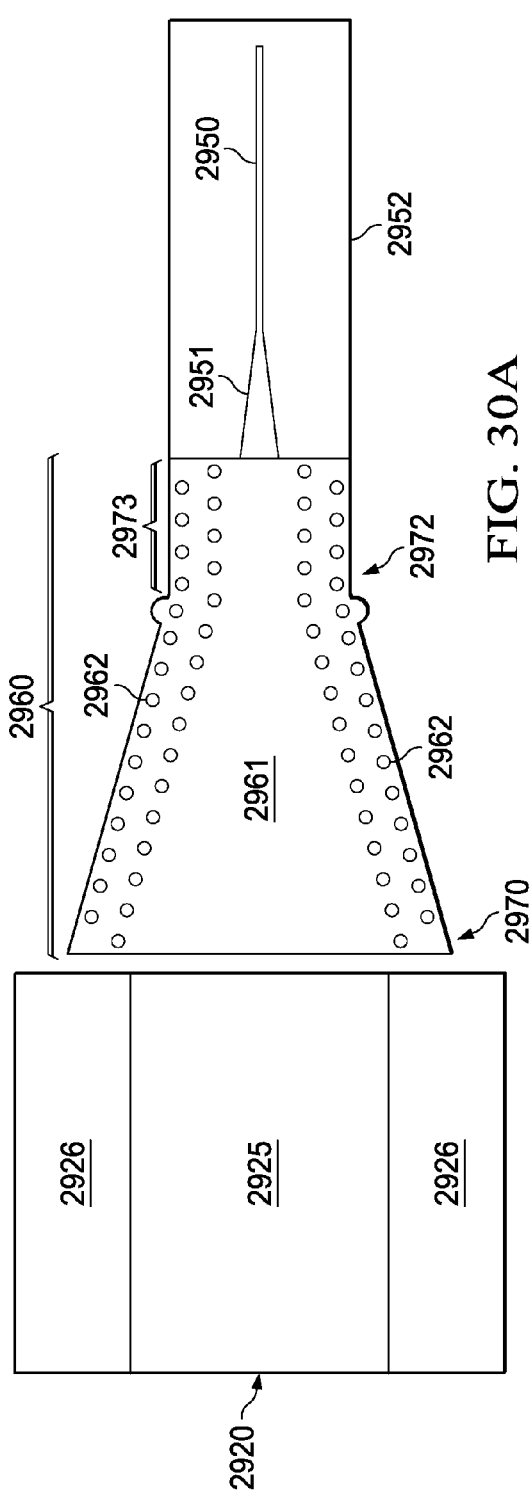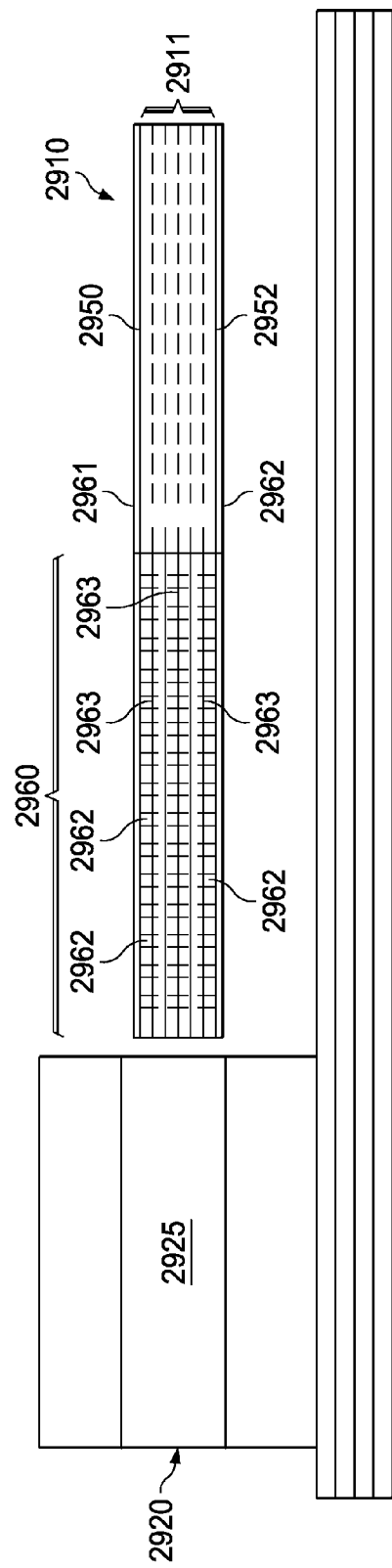

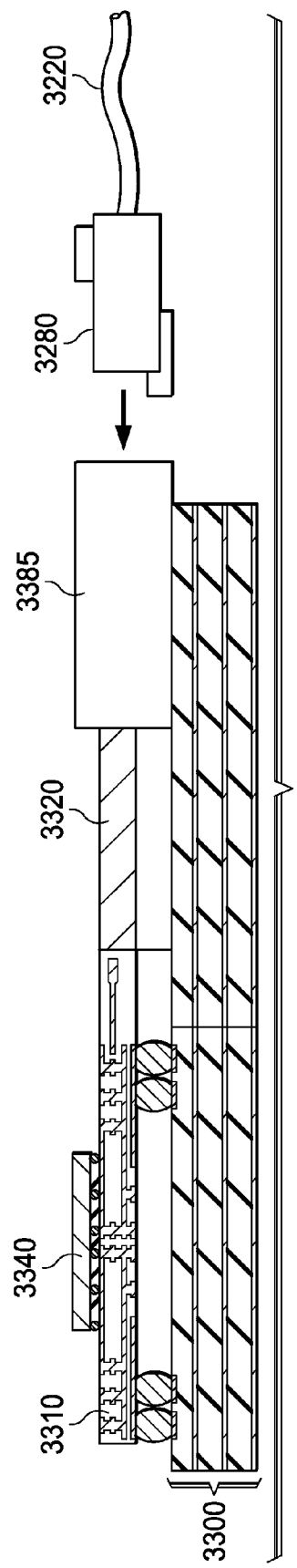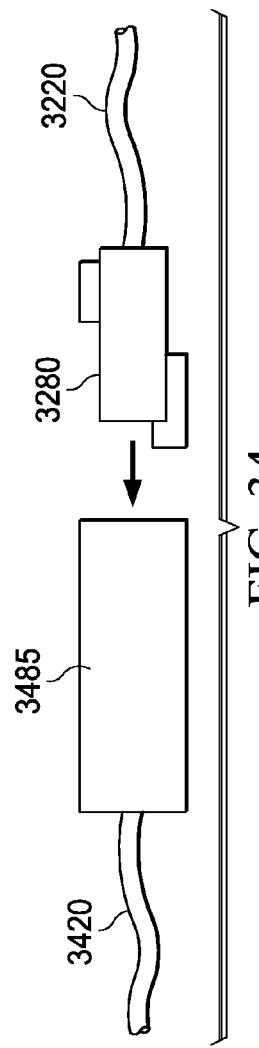
FIG. 33
FIG. 34

DIELECTRIC WAVEGUIDE WITH CORNER SHIELDING

CLAIM OF PRIORITY UNDER 35 U.S.C. 119(e)

The present application claims priority to and incorporates by reference U.S. Provisional Application No. 61/803,435 filed Mar. 19, 2013, entitled "Dielectric Waveguides."

FIELD OF THE INVENTION

This invention generally relates to dielectric wave guides for high frequency signals, and in particular to a dielectric waveguide with corner shielding.

BACKGROUND OF THE INVENTION

In electromagnetic and communications engineering, the term waveguide may refer to any linear structure that conveys electromagnetic waves between its endpoints. The original and most common meaning is a hollow metal pipe used to carry radio waves. This type of waveguide is used as a transmission line for such purposes as connecting microwave transmitters and receivers to their antennas, in equipment such as microwave ovens, radar sets, satellite communications, and microwave radio links.

A dielectric waveguide employs a solid dielectric core rather than a hollow pipe. A dielectric is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. If a dielectric is composed of weakly bonded molecules, those molecules not only become polarized, but also reorient so that their symmetry axis aligns to the field. While the term "insulator" implies low electrical conduction, "dielectric" is typically used to describe materials with a high polarizability; which is expressed by a number called the dielectric constant ($\in$k). The term insulator is generally used to indicate electrical obstruction while the term dielectric is used to indicate the energy storing capacity of the material by means of polarization.

The electromagnetic waves in a metal-pipe waveguide may be imagined as travelling down the guide in a zig-zag path, being repeatedly reflected between opposite walls of the guide. For the particular case of a rectangular waveguide, it is possible to base an exact analysis on this view. Propagation in a dielectric waveguide may be viewed in the same way, with the waves confined to the dielectric by total internal reflection at its surface.

BRIEF DESCRIPTION OF THE DRAWINGS

Particular embodiments in accordance with the invention will now be described, by way of example only, and with reference to the accompanying drawings:

FIGS. 30A and 30B are top and front views of the horn antenna of FIG. 29;

FIGS. 33-34 illustrates various applications of an RJ45 connector for coupling a DWG;

Figure 1:
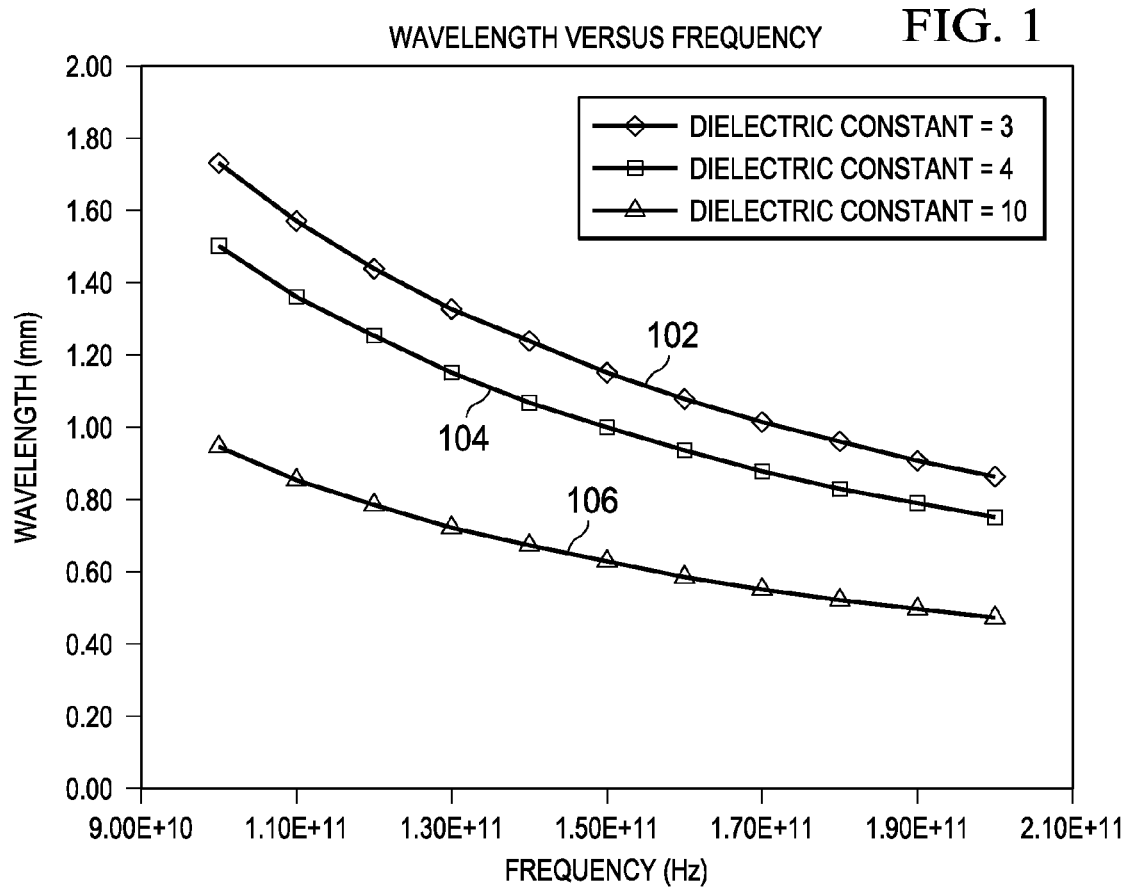
FIG. 1 is a plot of wavelength versus frequency through materials of various dielectric constants.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As frequencies in electronic components and systems increase, the wavelength decreases in a corresponding manner. For example, many computer processors now operate in the gigahertz realm. As operating frequencies increase sub-terahertz, the wavelengths become short enough that signal lines that exceed a short distance may act as an antenna and signal radiation may occur. FIG. 1 is a plot of wavelength versus frequency through materials of various dielectric constants. As illustrated by plot 102 which represents a material with a low dielectric constant of 3, such as a printed circuit board, a 100 GHz signal will have a wavelength of approximately 1.7 mm. Thus, a signal line that is only 1.7 mm in length may act as a full wave antenna and radiate a significant percentage of the signal energy.

Waves in open space propagate in all directions, as spherical waves. In this way they lose their power proportionally to the square of the distance; that is, at a distance R from the source, the power is the source power divided by R2. A wave guide may be used to transport high frequency signals over relatively long distances. The waveguide confines the wave to propagation in one dimension, so that under ideal conditions the wave loses no power while propagating. Electromagnetic wave propagation along the axis of the waveguide is described by the wave equation, which is derived from Maxwell's equations, and where the wavelength depends upon the structure of the waveguide, and the material within it (air, plastic, vacuum, etc.), as well as on the frequency of the wave. Commonly-used waveguides are only of a few categories. The most common kind of waveguide is one that has a rectangular cross-section, one that is usually not square. It is common for the long side of this cross-section to be twice as long as its short side. These are useful for carrying electromagnetic waves that are horizontally or vertically polarized.

For the exceedingly small wavelengths encountered for sub-THz radio frequency (RF) signals, dielectric waveguides perform well and are much less expensive to fabricate than hollow metal waveguides. Furthermore, a metallic waveguide has a frequency cutoff determined by the size of the waveguide. Below the cutoff frequency there is no propagation of the electromagnetic field. Dielectric waveguides have a wider range of operation without a fixed cutoff point. Various types of dielectric waveguides and techniques for coupling a dielectric waveguide to an integrated circuit or to another dielectric waveguide are described herein.

FIGS. 2A-2D illustrate various configurations of dielectric waveguides produced using printed circuit board technology. A dielectric waveguide may be used as an interconnect for chip to chip high data rate communication on a printed circuit board (PCB). Embodiments of this dielectric waveguide are capable of being assembled in a manufacturing line as an additional surface mount part and are able to resist a lead-free solder reflow process during assembly of the PCB.

Figure 2A:
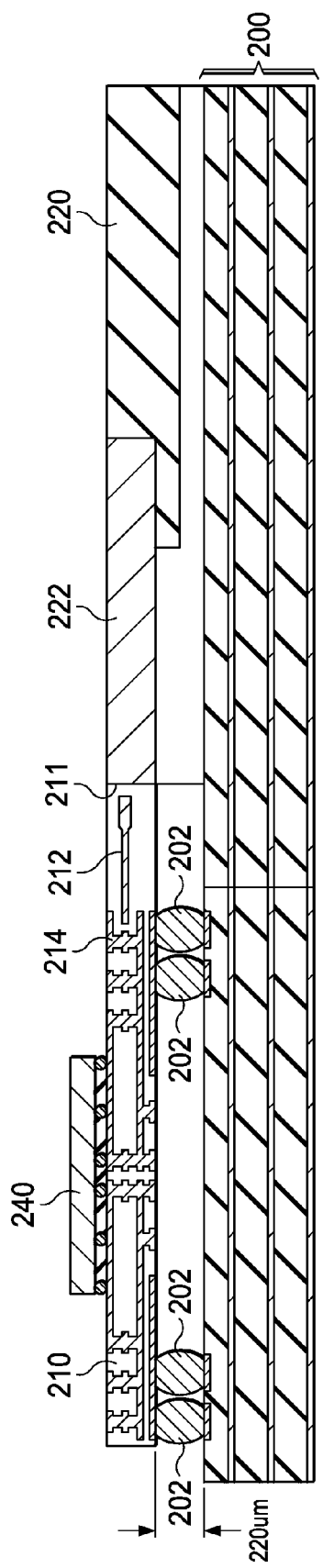
FIGS. 2A-2D illustrate various configurations of dielectric waveguides (DWG) produced using printed circuit board technology.

FIG. 2A illustrates a multilayer PCB 200 that contains several conductive layers separated by insulating layers. The various conductive layers may be patterned into interconnect patterns and interconnected by vias, as is well known Vias are also brought to the surface of the PCB and provide connection pads for an integrated circuit (IC) substrate 210. Solder balls 202 provide an electrical connection between the pins on carrier 210 and the via pads on PCB 200, as is well known. IC 240 is mounted on substrate 210 and contains circuitry that generates a high frequency signal using known techniques.

IC 210 includes high frequency circuitry that produces a signal that is connected to dipole antenna 212. A dielectric waveguide 220 is interfaced to the dipole antenna and reflector 214 by an interface region 222 that may be part of the dielectric waveguide. Dielectric waveguide (DWG) 220 is mounted on PCB 200 and must be able to withstand the reflow process that is used to attach IC 210 to the PCB.

Figures 2B, 2C, 2D:
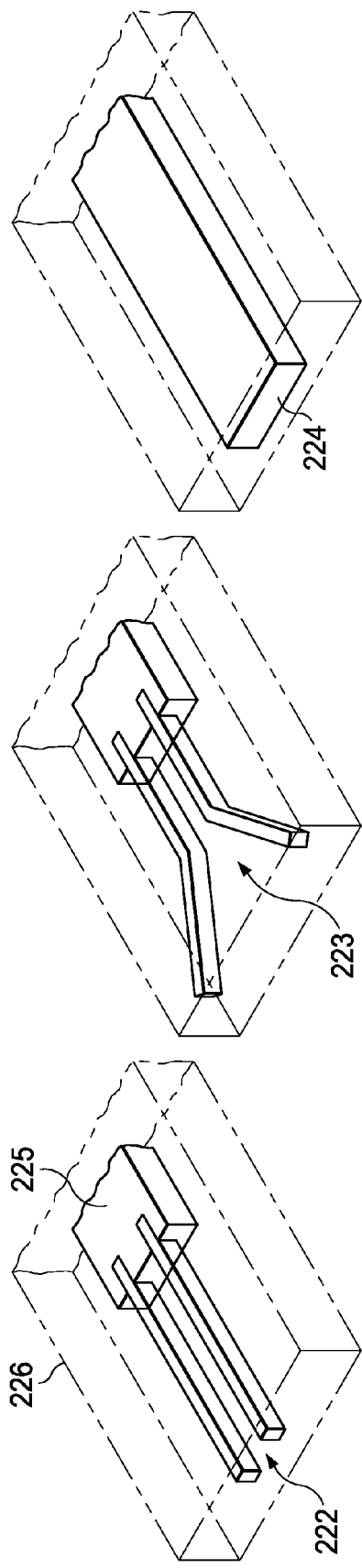

Dielectric waveguide 220 may be fabricated using standard PCB manufacturing techniques. PCB manufacturers have the ability to create board materials with different dielectric constants by using micro-fillers as dopants, for example. A dielectric waveguide may be fabricated by routing a channel in a low dielectric constant ($\in$k2) board material and filling the channel with high dielectric constant ($\in$k1) material. FIGS. 2B-2D illustrate three interface options that may be used to interface DWG 220 with microelectronic device substrate 210. FIG. 2B illustrates an interface region 222 that is formed by a metallic waveguide that it is made using vertical walls of copper and top and bottom copper layers (not shown in the drawing). DWG core member 225 is made from a material having a high dielectric constant, while cladding 226 is made from PCB material that has a lower dielectric constant. FIG. 2C illustrates a similar idea but a horn 223 is formed to help capture more radiation from the dipole antenna of the microelectronic device substrate 210. FIG. 2D illustrates an approach that does not use a metallic waveguide. The interface is simply made between the dipole antenna 212 of IC carrier substrate 210 and dielectric mating edge 224 of waveguide 220. Any one of these three waveguide designs may be manufactured by repeating it many times in a PCB and then sawing the PCB board into individual waveguides that can be used as individual surface mount parts.

Figure 3A:
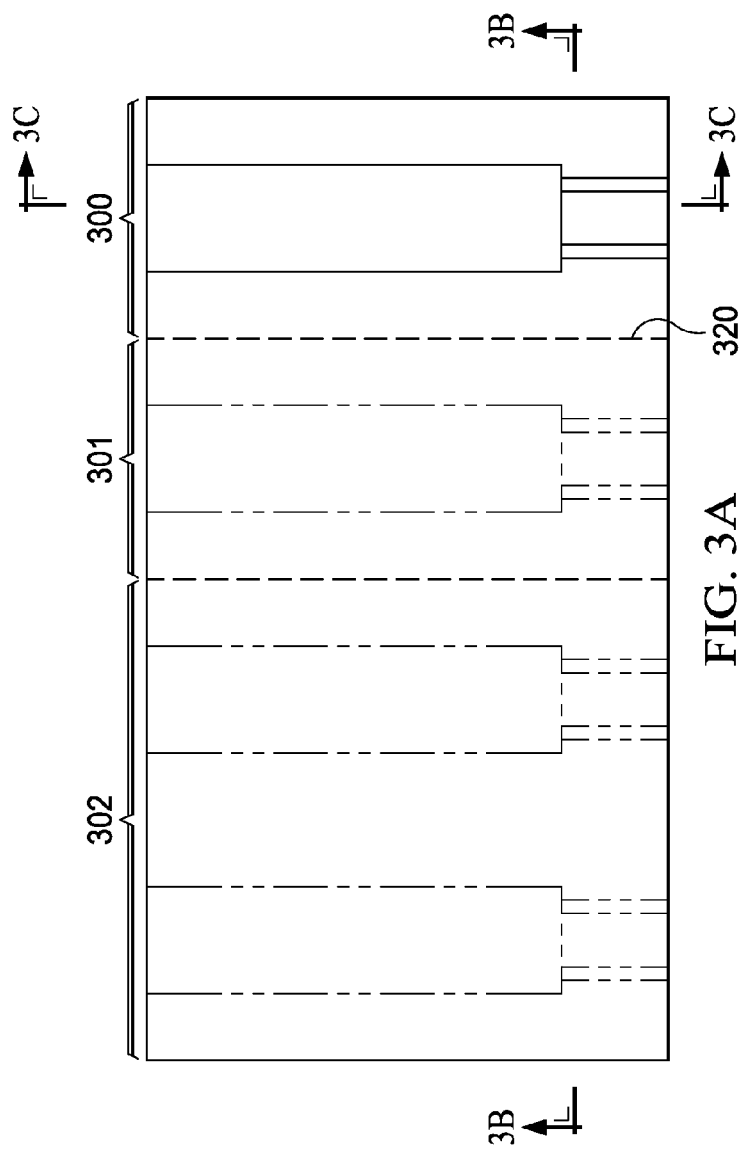
FIGS. 3A-3C together are an orthographic projection of an example dielectric waveguide.
Figure 3C:
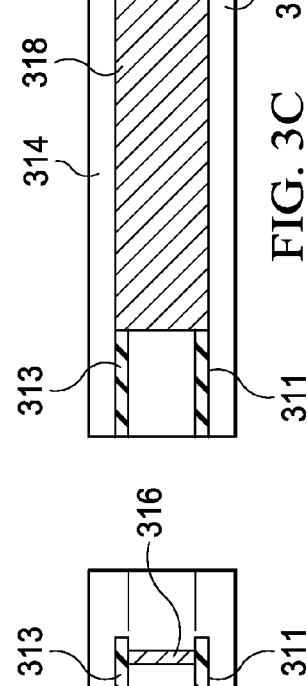
Figure 3B:
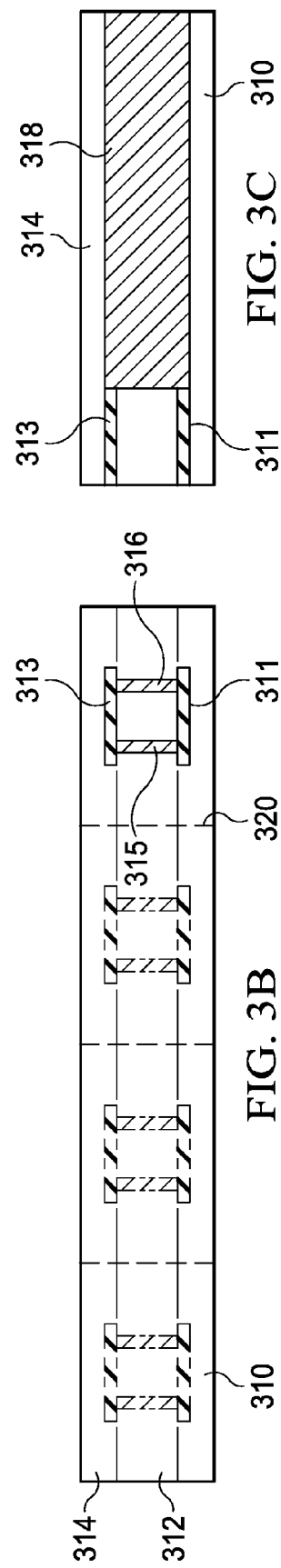

FIGS. 3A-3C together are an orthographic projection of an example dielectric waveguide 300 that is similar to FIG. 2B that is fabricated using a typical PCB manufacturing technique. FIGS. 3A-3C illustrate how DWG 300 is fabricated. In this example, three DWGs 300-302 are illustrated as being sliced from a single PCB; however, this is for illustration only and typically a larger number of DWGs may be fabricated on one PCB and then sliced into individual DWGs along cutting lines 320. Note that DWG 302 includes two channels; a larger number of channels may be fabricated in the same manner.

Figure 4:
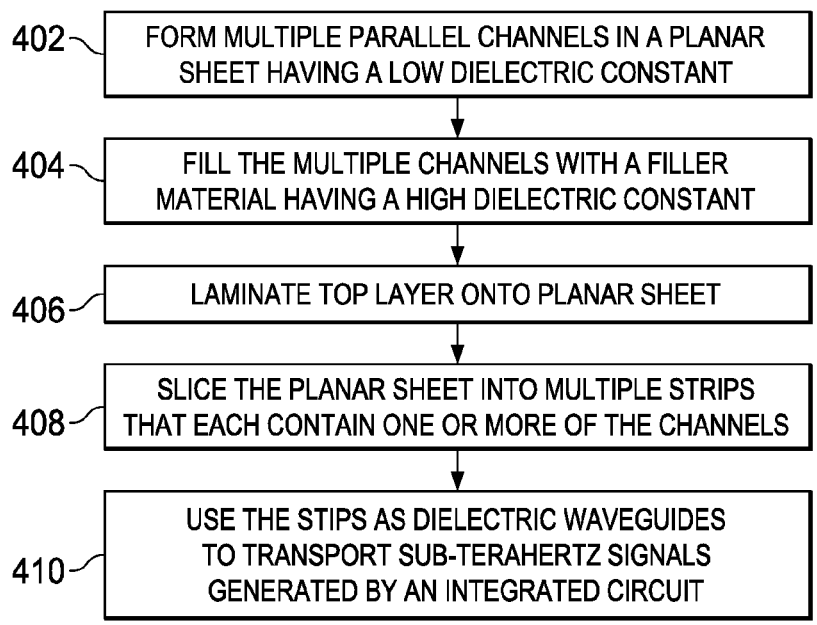
FIG. 4 is a flow chart illustrating a process for fabricating a dielectric waveguide.

FIG. 4 is a flow chart illustrating a process for fabricating a dielectric waveguide. Referring also to FIG. 3, a PCB initial substrate layer 310 includes a copper, or other conductive layer 311 that is etched to form a bottom side for metallic waveguide portion 222, or 223, referring again to FIG. 2B, 2C. Copper layer 311 is omitted when a DWG as illustrated in FIG. 2D is fabricated. A grove is formed 402 into substrate layer 310 for each DWG channel. The channel is typically rectangular, typically twice as wide as it is deep. The dimensions are selected based on the frequency and resulting wavelength that the DWG is intended to transport, based on known waveguide theory. The channels may be formed by various known techniques, such as: mechanical routing or milling, by scraping with a chisel bit, by etching through a mask using chemical etchant or media blasting, etc.

Sidewalls 315, 316 for a metallic waveguide portion, such as portion 222, or 223, referring again to FIG. 2B, 2C, may be formed using a process similar to forming vias. Similar to forming holes for a via, a trench is routed for each sidewall and then plated with a process similar to that used for vias. The dimensions of the metallic waveguide portion may be similar to the dimensions for the dielectric core portion, or one may be somewhat larger than the other. The process of forming the channel groves may also remove the material between the sidewalls after the sidewalls have been formed.

Once the channels are formed, they may be filled 404 with a PCB board material that has a higher different dielectric constant to form core members 318. PCB substrate layer 310 typically has a dielectric constant value that may be in the range of approximately 2.5-4.5. Micro-fillers may be used as dopants to raise the dielectric constant value of core member 318 so that core member 318 has a higher dielectric constant than cladding material 310, 312, and 314. Typically, the dielectric constant of the core member may be selected from a range of values of approximately 3-12 using commonly available materials and dopants. Various types of material may be used as a dopant, such as: ZnO, or BaTiO3, for example. PCB and filler materials are available from various sources, such as Roger Corporation: RO3003 for the PCB, and RO3006 or RO3010 for the filler, for example.

A top layer 314 that also has an etched copper layer 313 may be laminated 406 on top of substrate layer 310 to form a top portion of cladding 226. In some embodiments, the top layer 314 may be omitted and the sliced DWG may be mounted upside down on a PCB carrier board, such as PCB 200, to form the remaining cladding portion. In other embodiments, the top layer may be omitted and air, which has a dielectric constant of approximately 1.0, will form the top portion of the cladding. Optionally, a conformal coating or other protective layer may be applied over planar layer 310 in embodiments in which top layer 314 is omitted. Typically, when the DWG will not be subjected to touching by human or other nearby objects, the top layer may be omitted to save expenses.

Planar layer 310 is then sliced 408 to produce the individual DWG 300-302, for example. Each individual DWG may contain one channel, or it may contain two or more channels, depending on how planar layer 310 is sliced.

The individual DWG may then be mounted 410 on a carrier PCB and used to transport sub-terahertz signals that are produced by an integrated circuit, such as IC 240.

Referring again to FIG. 2A, dipole antenna 212 and reflector 214 provide a structure to launch a signal from a microelectronic device into a dielectric waveguide. On the other end of the dielectric waveguide interconnect, a similar structure may be used to acquire the signal from the waveguide into the microelectronic device.

Dipole antenna 212 may be used by the microelectronic device to radiate the signal into a dielectric waveguide 220 that is located outside the package but very close to it. By its nature, dipole antenna 212 will radiate in a very oriented radiation pattern towards the dielectric waveguide but also in the direction opposite to it, which is towards the core of the package. A reflector on the backside of the dipole antenna will reflect the radiation radiated towards the center of the package back in the direction of the dielectric waveguide.

Two different launching structure designs will now be described in more detail. One design is useful for interfacing with a dielectric waveguide in a direction coplanar with the PCB, while the second design is useful for interfacing with a dielectric waveguide placed perpendicular to the plane defined by the PCB.

Figure 5:
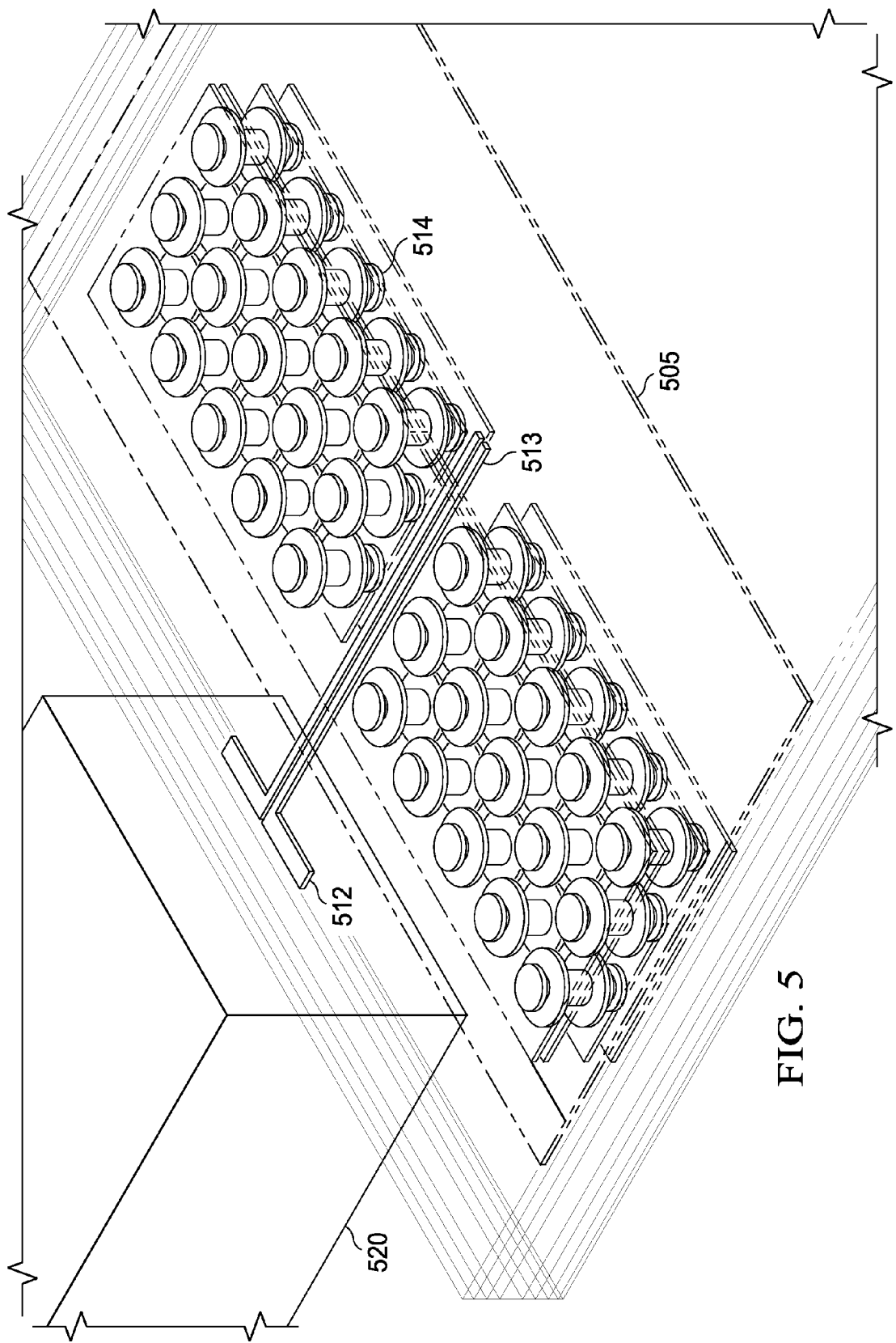
FIG. 5 is an isometric view of a reflector for use with a dipole antenna.
Figure 6:
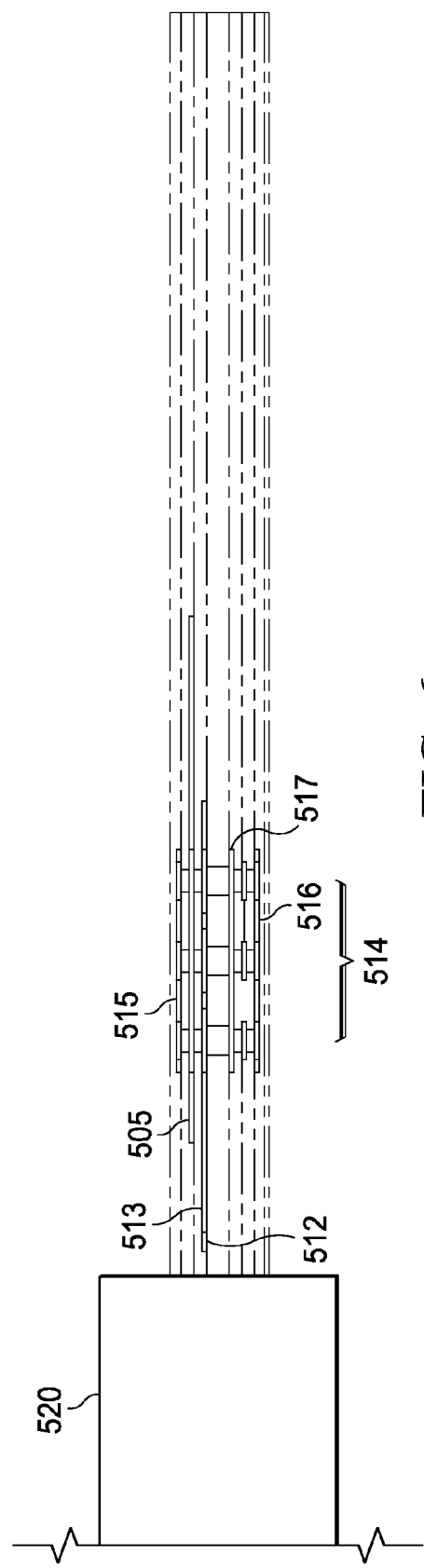
FIG. 6 is a sectional view of the reflector of FIG. 6.

FIG. 5 is an isometric view and FIG. 6 is a sectional view of a reflector array 514 for use with a dipole antenna 512, which is an expanded view of the dipole antenna 212 and reflector 214 illustrated in FIG. 2A. Referring back to FIG. 2A, note the location of dipole antenna 212 and reflector 214 within substrate 210. An outside edge of carrier 212 forms an interface surface 211 that is configured for interfacing to DWG 220. Reflector structure 214 is formed in the carrier substrate adjacent to dipole antenna 212 and opposite from the interface surface 211.

Referring again to FIG. 5, differential signal lines 513 connect the dipole antenna 512 to IC 240 that is generating or receiving a sub-terahertz high frequency signal.

Ground plane 505 orients a signal launched from dipole antenna 512 in a direction towards DWG 520, but also in a direction away from DWG 520. Reflector 514 is an array of metalized vias between two coplanar plates 515, 516 that are above and below the plane that holds the dipole antenna 512. In some embodiments, there may be an additional reflector strap 517 coupled to the array of vias and running essentially parallel to the dipole antenna in the same plane as the dipole antenna. Additional parallel reflector straps may be added on other layers, if present. The goal is to erect an essentially vertical metallic "wall" that reflects radiated energy from dipole antenna 512 back towards DWG 520. The vias may be connected to ground, or may be left floating. The metal structure acts a "short" to the radiated field from the dipole antenna. Spacing the metal reflector structure approximately one half of a wavelength from the dipole antenna provides an optimum amount of reflection. Alternatively, the reflector structure may be placed a distance of 1.5, 2.5, etc wavelengths from the dipole antenna. While a distance of one half wavelength is optimum, a distance in the range of 0.3-0.7 or multiples thereof provides a useful amount of reflection.

Figure 7:
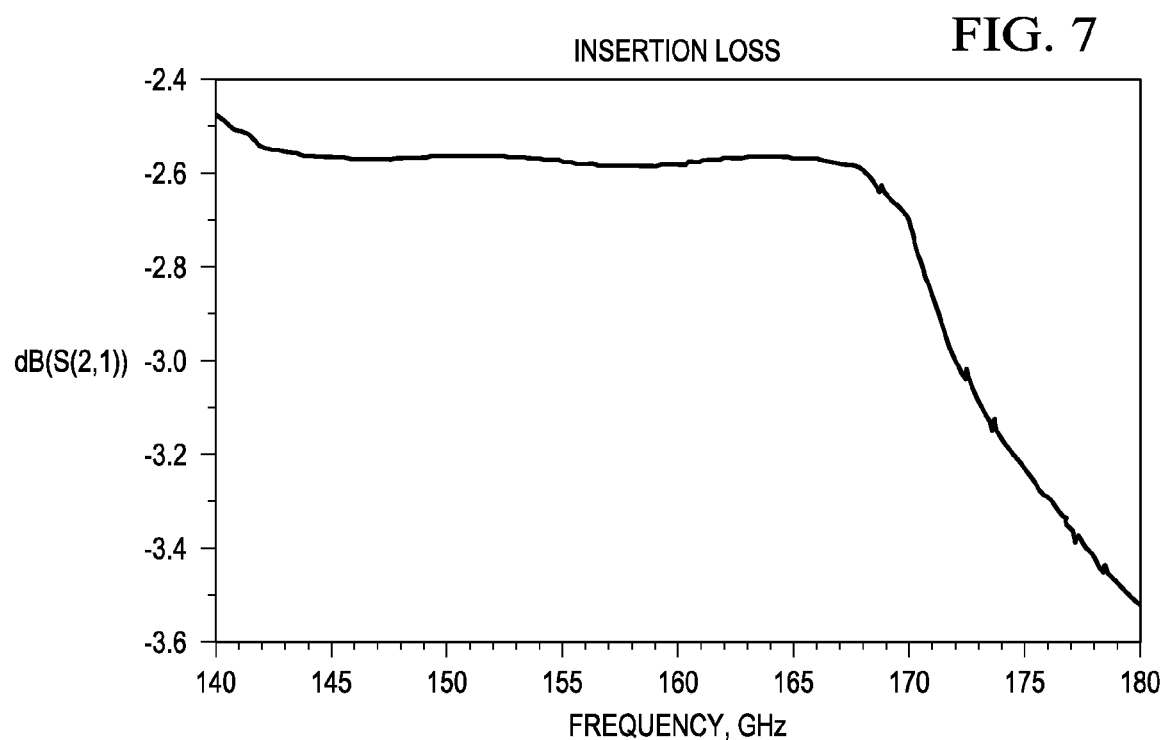
FIG. 7 is a plot showing insertion loss for the dipole antenna and reflector of FIG. 5.

FIG. 7 is a plot showing insertion loss for dipole antenna 512 and reflector 514 based on a simulation of this configuration. Note the insertion loss is fairly constant at approximately −2.6 db up to about 168 GHz.

Figure 8A:
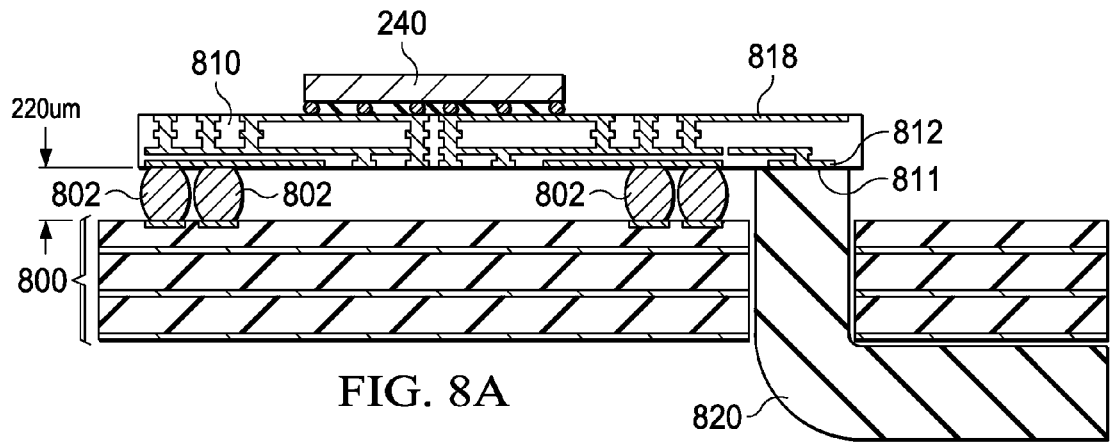
FIGS. 8A and 8B illustrate another embodiment of a DWG coupled to an integrated circuit (IC)
Figure 8B:
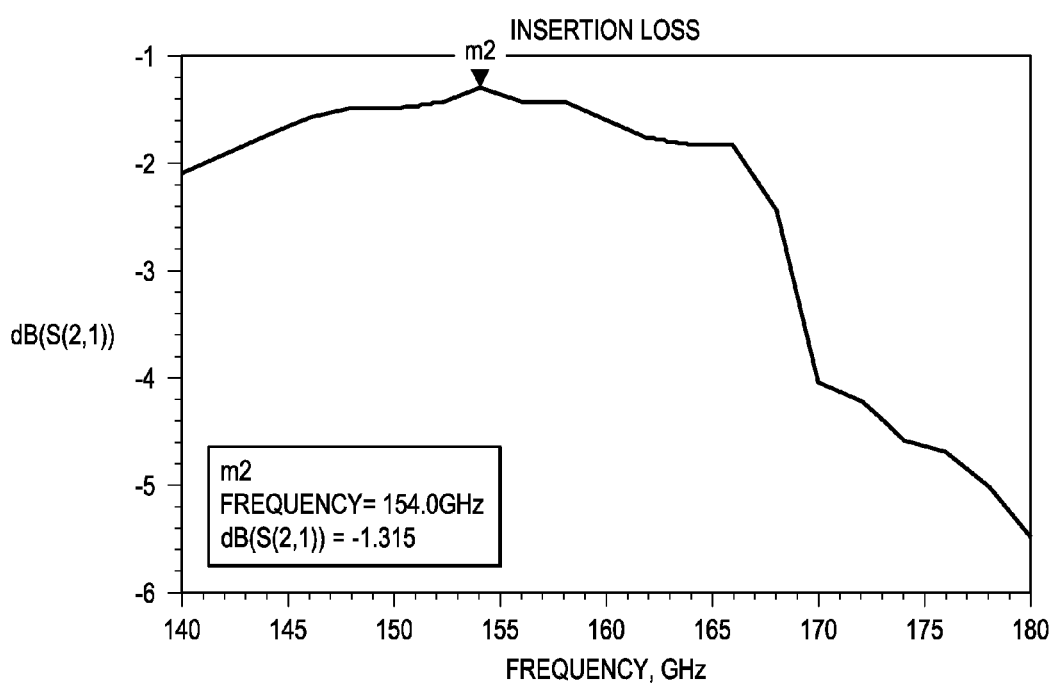

FIGS. 8A and 8B illustrate another embodiment of a DWG coupled 820 to an integrated circuit 240. In this embodiment, DWG 820 is interfaced to an interface surface 811 on the bottom side of carrier 810 that is configured for interfacing DWG 820 through a hole in PWB 800. A reflector structure 818 is formed in the carrier substrate adjacent to dipole antenna 812 and opposite from the interface surface 811. In this embodiment, reflector structure 818 may be a metallic plate positioned above dipole antenna 812. Spacing the metal reflector structure approximately one half of a wavelength from the dipole antenna provides an optimum amount of reflection. Alternatively, the reflector structure may be placed a distance of 1.5, 2.5, etc wavelengths from the dipole antenna. While a distance of one half wavelength is optimum, a distance in the range of 0.3-0.7 or multiples thereof provides a useful amount of reflection. Reflector plate 818 may be connected to ground, or may be left floating.

FIG. 8B is a plot illustrating insertion loss for dipole antenna 812 and reflector 814 based on a simulation of this configuration. Note the insertion loss is less than approximately −2 db up to about 166 GHz.

As can be seen, a reflector structure in combination with a dipole antenna provides a good way to launch or receive sub-terahertz signals that are generated or received by an integrated circuit. The two embodiments described herein provide a low insertion loss and are easy to implement. They provide implementation options for applications that need parallel or perpendicular orientation of the dielectric waveguides with respect to the PCB.

Figure 9:
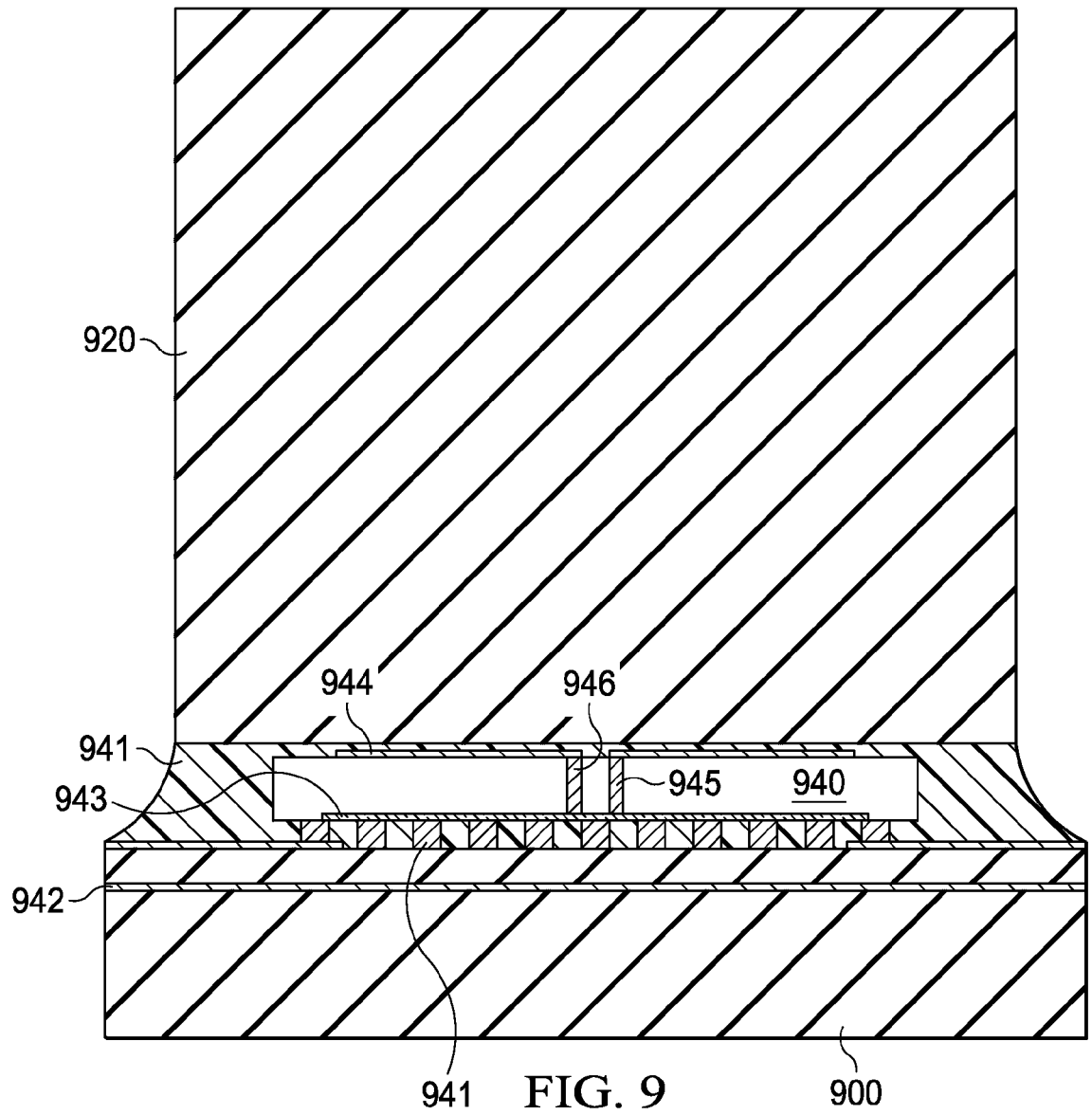
FIGS. 9-10 illustrate embodiments for interfacing a DWG directly to an IC.
Figure 10:
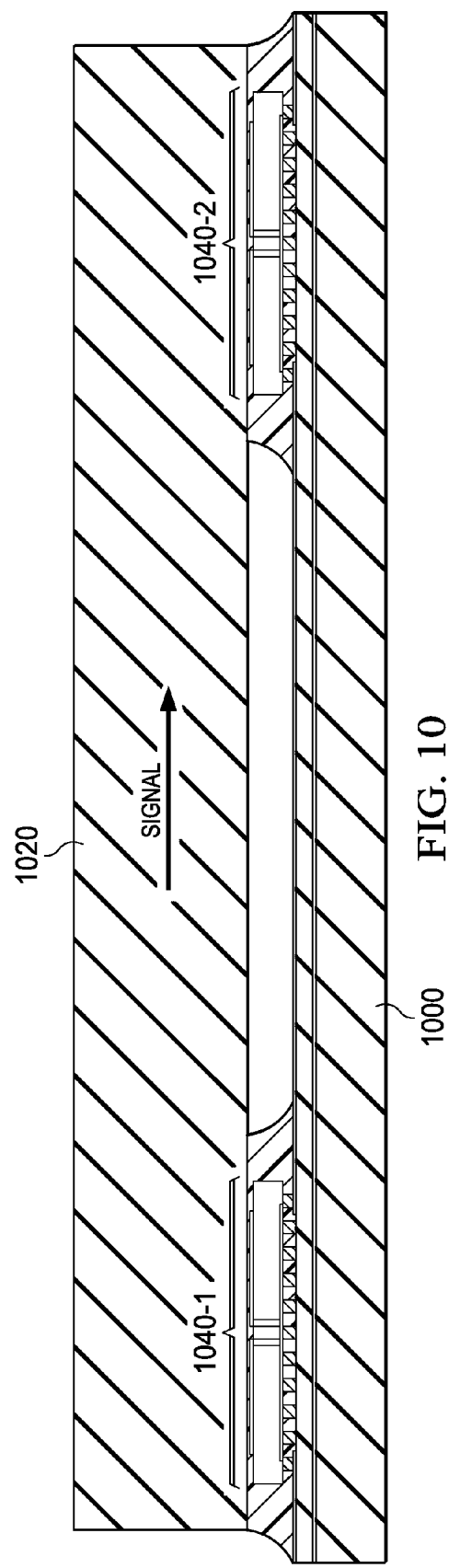

FIGS. 9-10 illustrate embodiments for interfacing a DWG directly to an IC. A chip scale package (CSP) is a type of integrated circuit chip carrier. In order to qualify as chip scale, the package typically has an area no greater than 1.2 times that of the die and it is a single-die, direct surface mountable package. Another criterion that is often applied to qualify these packages as CSPs is their ball pitch should be no more than 1 mm. The die may be mounted on an interposer upon which pads or balls are formed, like with flip chip ball grid array (BGA) packaging, or the pads may be etched or printed directly onto the silicon wafer, resulting in a package very close to the size of the silicon die. Such a package is called a wafer-level chip-scale package (WL-CSP) or a wafer-level package (WLP).

A technique for interfacing a microelectronic device directly with a dielectric waveguide used for THz RF communication will now be described. At frequencies above sub-THz, copper cannot be used to conduct an electromagnetic signal due to extreme increase in impedance due to the known 'skin depth effect'. As discussed above, an electromagnetic RF signal may be transported using a dielectric waveguide that may have dimensions similar to the DWG described above for signals at sub-THz frequency.

Referring to FIG. 9, in this example, a Chip Scale Package 940 constitutes a microelectronic device. In CSP devices, semiconductor logic and circuits that may produce or receive a sub-THz RF signal are formed in an epi-layer 943. In this example, CSP 940 is mounted on a PCB 900 that may have additional devices mounted to it. In this example, solder bumps 941 secure SCP 940 to PCB 900; however, in other embodiments different types of mounting schemes that are now known or later developed may be used.

The RF signal may be conducted to the opposite side of the chip using through-silicon-via (TSV) technology. A through-silicon via is a vertical electrical connection (Vertical Interconnect Access) passing completely through a silicon wafer or die. TSVs are a high performance technique used to create 3D packages and 3D integrated circuits. Compared to alternatives such as package-on-package, TSVs provide a density of the vias that may be substantially higher, and provide connection lengths that may be shorter.

On the opposite side of the chip from epi layer 943, a patterned metallization constitutes an antenna 944 to transmit and/or receive the RF signal from a dielectric waveguide 920. In this example, DWG 920 is mounted vertically, i.e., perpendicular to the chip. FIG. 10 illustrates and example where the DWG is mounted horizontally, i.e. parallel to the chip. The metalized antenna may be formed is several ways, such as by using sputtering, thermal or e-gun evaporation technologies, for example. This metallization may be realized using various known or later developed metallization process, such as forming a Titanium layer in contact with the Si to work as a adhesion layer, forming an Ni layer on top of the Titanium to work as a barrier layer (to avoid contamination of the Si die) and above this last layer forming a layer of Aluminum, Copper, Gold or any other metal with high electrical conductivity, for example.

The antenna may be patterned in the back side of the silicon die using a hard mask or using a photolithography process, for example. The antenna may be a simple dipole antenna, a Marconi antenna, or a more elaborate patch antenna, for example. In this example, two through silicon vias 945, 946 provide a differential RF signal to/from the antenna to epi layer 943.

A ground plane 942 embedded in PCB 900 is used as an electromagnetic reflector to reflect back towards the dielectric waveguide the signal that the antenna may be sending in the direction opposite to the dielectric waveguide. Under-fill material 941 may be installed to attach DWG 920 to SCP 940.

This technique results in low insertion loss between SCP 940 and DWG 920, is easy to implement, and uses standard manufacturing materials and fabrication techniques.

FIG. 10 illustrates an example system that includes a PCB 1000 upon which are mounted SCP 1040-1 and 1040-2. SCP 1040-1 includes circuitry that generates a sub-terahertz or terahertz signal that is conveyed to SCP 1040-2 via DWG 1020 using through silicon vias to a back mounted antenna, as described above. Similarly, SCP 1040-2 includes circuitry that receives the sub-terahertz or terahertz signal that is conveyed via DWG 1020 using through silicon vias coupled to a back mounted antenna, as described above. PCB 1000 is similar to PCB 900 and includes a ground plane for reflecting energy radiated by a dipole antenna in SCP 1040-1 back towards DSG 1020. In this example, DWG 1020 has an interface surface on its side at each end for interfacing with the antennas on the back side of SCP 1040-1 and 1040-2 which allows DWG 1020 to be mounted horizontally from chip to chip.

In some embodiments, a short section of DWG may be permanently attached to a CSP or other type of packaged IC, as illustrated above with respect to FIG. 2A, 8A, 9, or 10 to form a module. It may then become necessary to couple the DWG segment included in the module to another DWG segment. Various schemes for interfacing segments of DWG will now be described.

Figure 11:
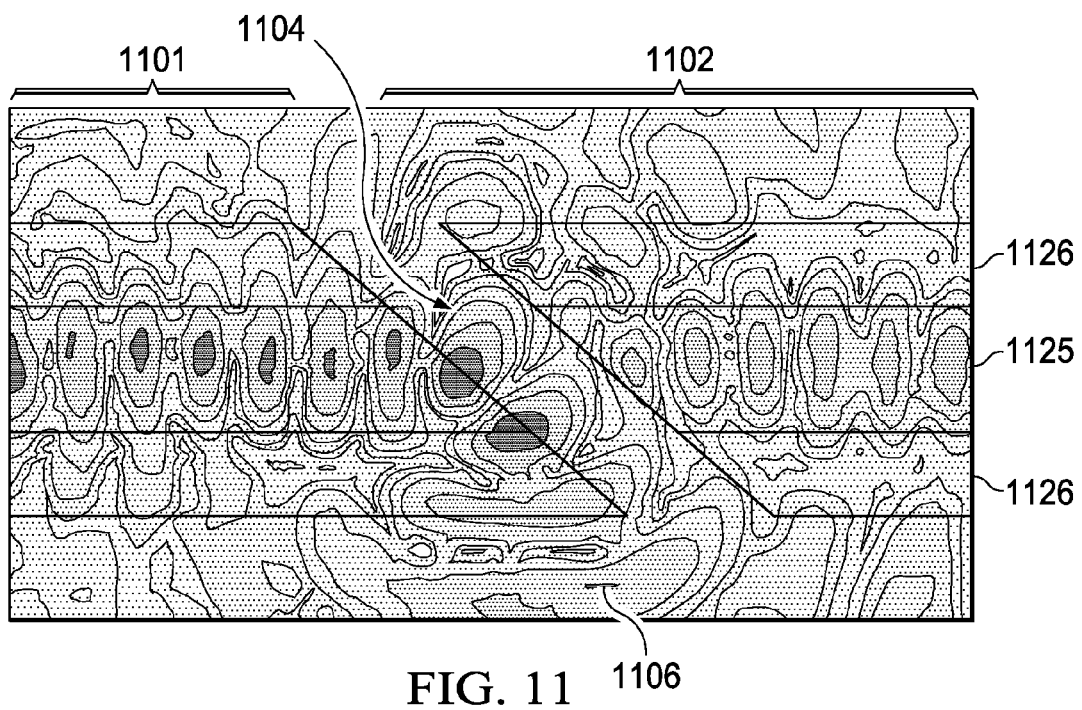
FIGS. 11-13 illustrate simulations of radiated energy from various DWG interface configurations.
Figure 12:
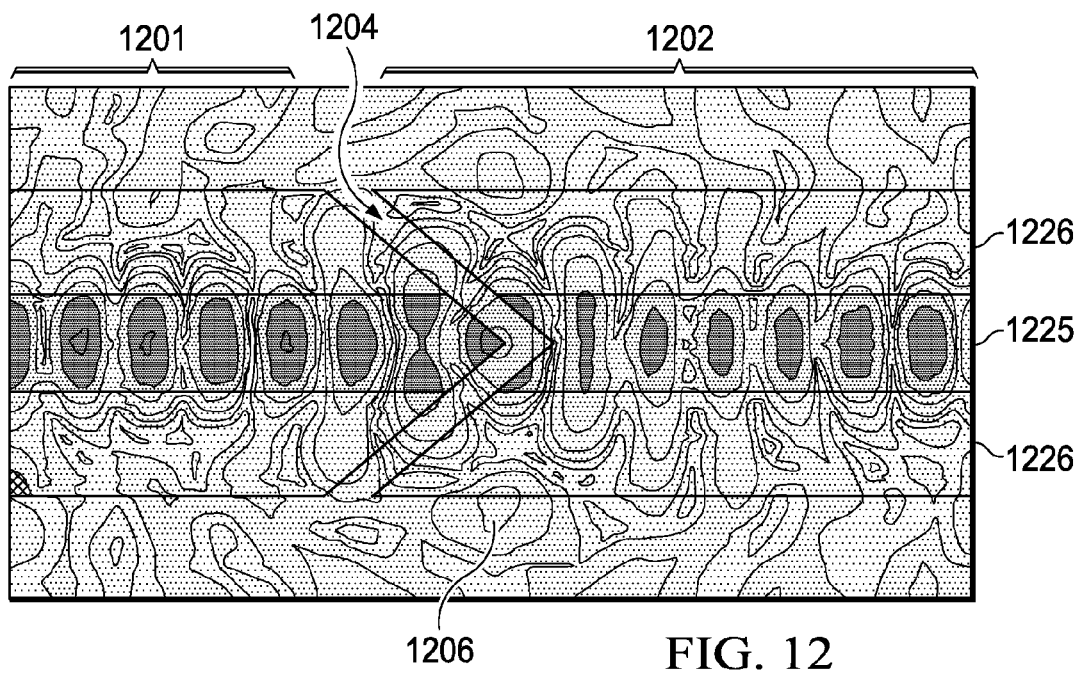
Figure 13:
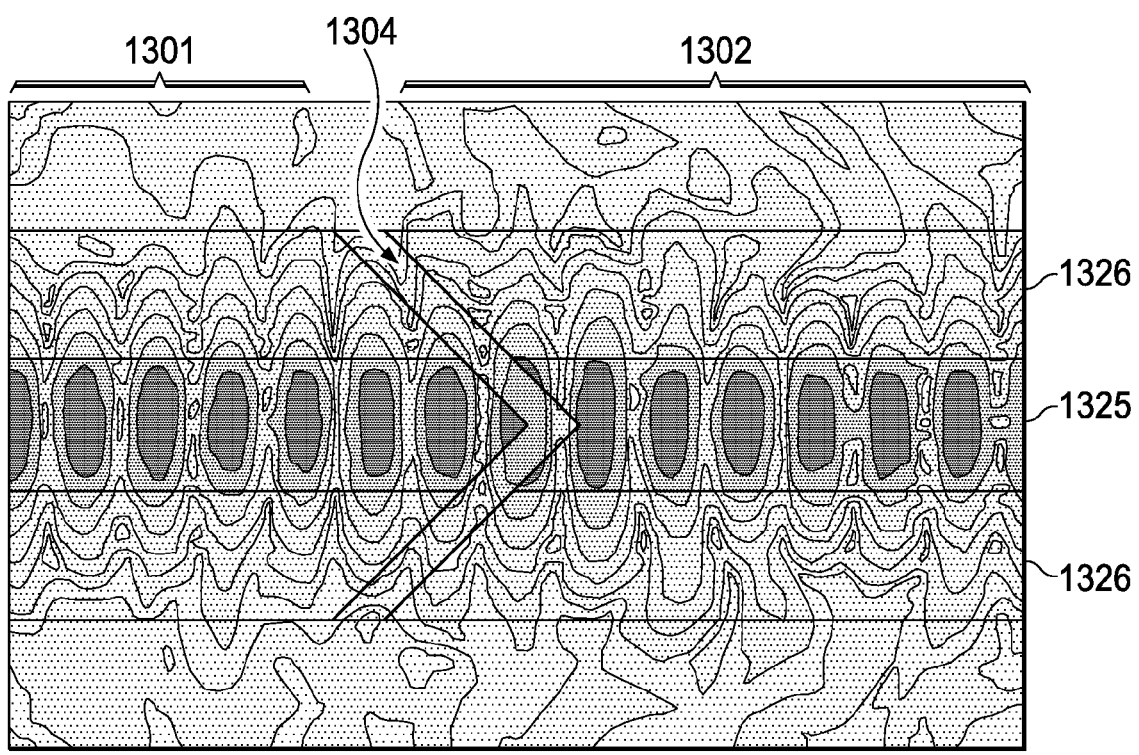

FIGS. 11-13 illustrate simulations of radiated energy for various DWG interface configurations. This interface could be used to connect two identical waveguides to extend the length, for example, or to connect two different waveguides in the case where one of them may be part of an electronic device such as: a computer, server, smart-phone, tablet or any other communication device, etc. For example, a DWG segment that is part of an IC module may be coupled to another DWG segment.

When two dielectric waveguides are coupled together, there is likely to be a gap between the two DWGs. This gap creates an impedance mismatch that may generate significant losses due to radiated energy produced by the impedance mismatch. The extent of the losses depends on the geometry of the gap and the material in the gap. Based on simulations, a square cut butt joint appears to provide a significant impedance mismatch.

Figure 14:
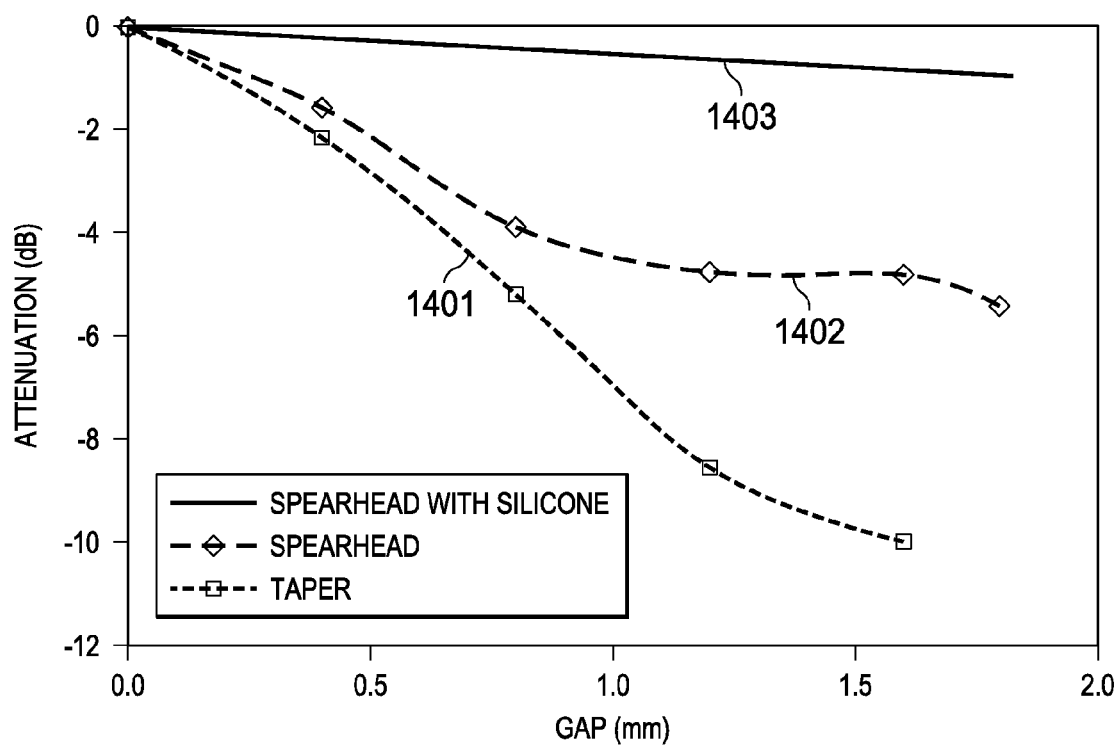
FIG. 14 is a plot illustrating insertion loss for various interface configurations.

FIG. 11 illustrates a simulation result for an inclined cut interface between two DWG segments 1101, 1102. The core member is indicated at 1125 and the cladding is indicated at 1126. In this example, gap 1104 is approximately 1.2 mm. Note that there is a significant amount of radiated energy, such as indicated by shaded regions 1106. In FIG. 14, plot line 1401 illustrates insertion loss vs. gap length for an inclined cut interface.

FIG. 12 illustrates a simulation result for a spearhead shaped cut interface between two DWG segments 1201, 1202. The core member is indicated at 1225 and the cladding is indicated at 1226. In this example, gap 1204 is approximately 1.2 mm. Note that there is a much smaller amount of radiated energy, such as indicated by shaded regions 1206. In FIG. 14, plot line 1402 illustrates insertion loss vs. gap length for a spear shaped interface.

This spearhead is effective if the taper is done in only two of the sides of the DWG but it is better when the taper is done in the four sides of the DWG to form a pyramidal shape. This taper could also be replaced by a conical shape on four sides or a vaulted shape on two sides, or any other shape that deflects energy back to the DWG from the signal deflected by the opposite side cut.

A spearhead, pyramidal, conical, vaulted or similar type shape provides an interface with a very low insertion loss, is easy to implement, is mechanically self-aligning, and is flexible and robust to small misalignments. These shapes may all be produced using standard manufacturing materials and fabrication techniques.

A simulator known as "High Frequency Simulator Structure" (HFSS), (available from ANSYS, Inc) was used analyze the various shapes discussed above. HFSS is a high performance full wave electromagnetic (EM) field simulator for arbitrary 3D volumetric passive device modeling. It integrates simulation, visualization, solid modeling, and automation using a finite element method (FEM) and an integral equation method. HFSS can extract scattering matrix parameters (S, Y, Z parameters), visualize 3-D electromagnetic fields (near and far-field), and generate Full-Wave SPICE models that link to circuit simulations.

Material in the Gap

In the examples discussed above, the material filling the gap is just air, which has a dielectric constant of approximately 1.0. As discussed earlier, the dielectric constant of the core material will typically be in the range of 3-12, while the dielectric constant of the cladding material will typically be in the range of 2.5-4.5. The mismatch impedance is proportional to the difference of the dielectric constant between the DWG and the material inside the gap. This means that even with the geometry of the socket optimized, an air gap between the DWGs is not an optimum configuration. In order to minimize the impedance mismatch, a DWG socket may be designed with a rubbery material that has a dielectric constant very close to the dielectric constant of the DWG core and cladding. A flexible material is desirable to accommodate and fill all the space in the gap. An example of a rubbery material with dielectric constant 2.5 to 3.5 is Silicone. Other materials with similar characteristics that may be used fall into two types: unsaturated rubber and saturated rubber.

Unsaturated rubbers include: Synthetic polyisoprene, Polybutadiene, Chloroprene rubber, Butyl rubber, Halogenated butyl rubbers, Styrene-butadiene Rubber, Nitrile rubber, Hydrogenated Nitrile Rubbers, etc, for example.

Saturated rubbers include: EPM (ethylene propylene rubber), EPDM rubber (ethylene propylene diene rubber), Epichlorohydrin rubber (ECO) Polyacrylic rubber (ACM, ABR), Silicone rubber (SI, Q, VMQ), Fluorosilicone Rubber (FVMQ, Fluoroelastomers (FKM, and FEPM) Viton, Tecnoflon, Fluorel, Perfluoroelastomers (FFKM) Tecnoflon PFR, Kalrez, Chemraz, Perlast, Polyether block amides (PEBA), Chlorosulfonated polyethylene (CSM), (Hypalon), Ethylenevinyl acetate (EVA), etc, for example.

FIG. 13 illustrates a simulation result for a spearhead shaped cut interface between two DWG segments 1301, 1302. The core member is indicated at 1325 and the cladding is indicated at 1326. In this example, gap 1304 is approximately 1.2 mm and is filled with a silicon material. Note that there is a negligible amount of radiated energy.

FIG. 14 is a plot illustrating insertion loss for various interface configurations versus gap length. Plot line 1403 illustrates insertion loss vs. gap length for a spear shaped cut interface with a silicon rubber gap filler. Plot line 1401 illustrates insertion loss vs. gap length for an inclined cut interface. Plot line 1402 illustrates insertion loss vs. gap length for a spear shaped cut interface.

It can be seen that using an optimized design with the spearhead geometry and filling the gap with Silicone material results in under 1 dB of attenuation for gaps as large as 1.5 mm, as illustrated by plot line 1403.

As the gap gets narrower, approaching 0.0 mm, the insertion loss for any of the configurations reduces to approximately zero; however, typically a gap of 0.0 is difficult to maintain when using economical, non-precision DWGs.

While the simulation illustrated in FIG. 13 uses a Silicon gap filler with a uniform dielectric constant of 2.5-3.5, in another embodiment a deformable gap filler may be fabricated that has a higher dielectric constant in a central region to better match the dielectric constant of the core material, while having a lower dielectric constant in an outer region to match the cladding of the DWGs.

Figure 15:
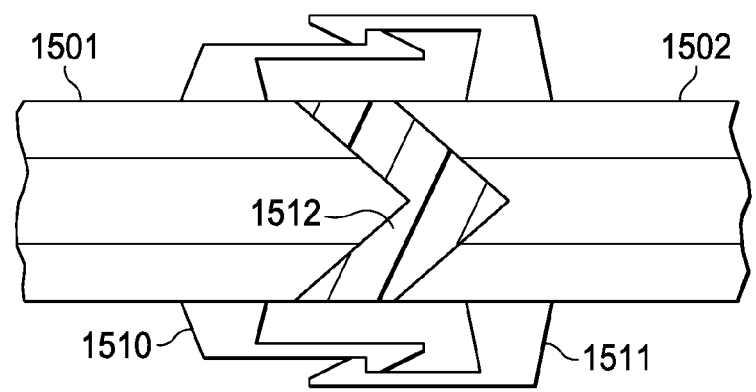
FIG. 15 illustrates two DWGs coupled with a snap connecter with a silicon gap filler material.

FIG. 15 illustrates two DWGs 1501, 1502 coupled with a snap connecter with a Silicon gap filler material 1512. One piece 1510 of the snap connector is mounted on an end of DWG 1510. Another piece 1511 of the snap connector is mounted on an end of DWG 1511. The mounting positions of the snap connector pieces are controlled so that when mated, the deformable gap filler material 1512 is compressed so as to eliminate most, if not all, air from the gap between DWG 1501 and DWG 1502.

While a particular configuration of a connecter is illustrated in FIG. 15, other embodiments may use any number of now known or later designed connector designs to couple together two DWGs while maintaining mechanical alignment and providing enough coupling force to maintain a deforming pressure on the gap filler material.

Typically, the deformable material may be affixed to either the male end of DWG 1501 or to the female end of DWG 1502, for example. The deformable material may be affixed in a permanent manner using glue, heat fusion, or other bonding technology. However, a thinner layer of deformable material may be affixed to the end of both DWG 1501 and to the end of DWG 1502 such that the gap is filled with two layers of deformable material.

Referring back to FIG. 8A, a DWG with a right angle corner may be used to connect to the bottom side of an IC module, for example. Another use may be to connect from a backplane to a PWB that is inserted into the backplane in a perpendicular manner. As can be seen, there are many uses for a DWG with a right angle corner. A problem is that an electromagnetic signal travelling inside a dielectric waveguide may suffer significant losses when traversing an abrupt corner. This is a very serious problem because dielectric waveguides applications often require them to be able to bend in a 90 degree corner and may need to do so with a short radius of curvature.

Figure 16B:
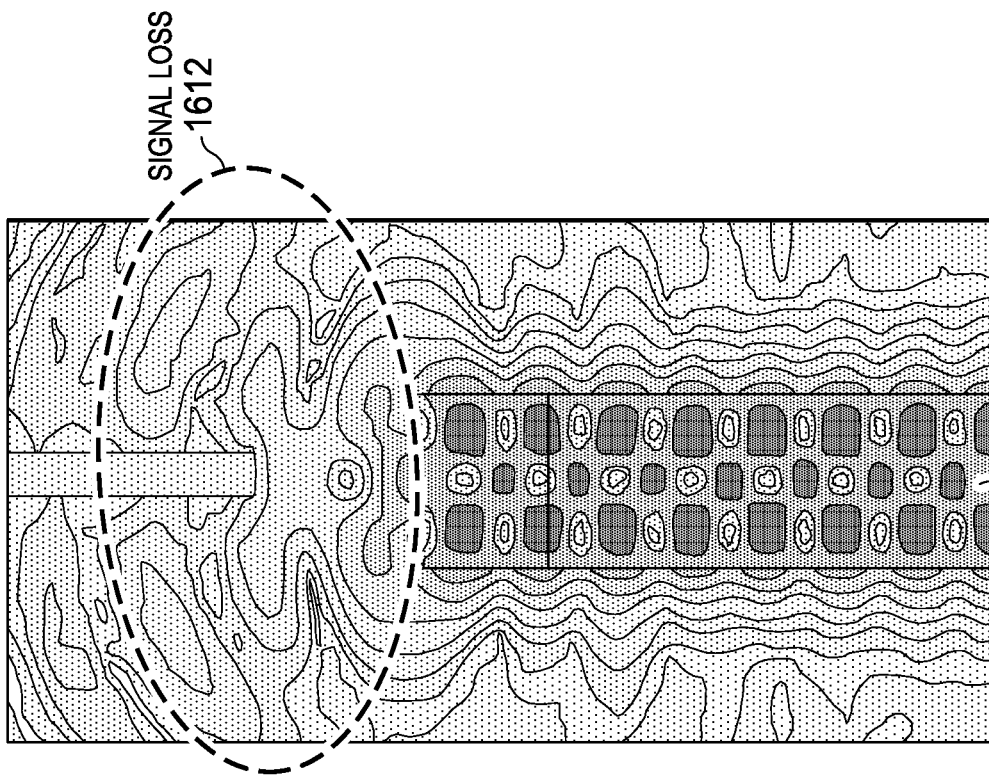
FIGS. 16A-16B illustrate simulations of radiated energy from a right angle corner of a DWG.
Figure 16A:
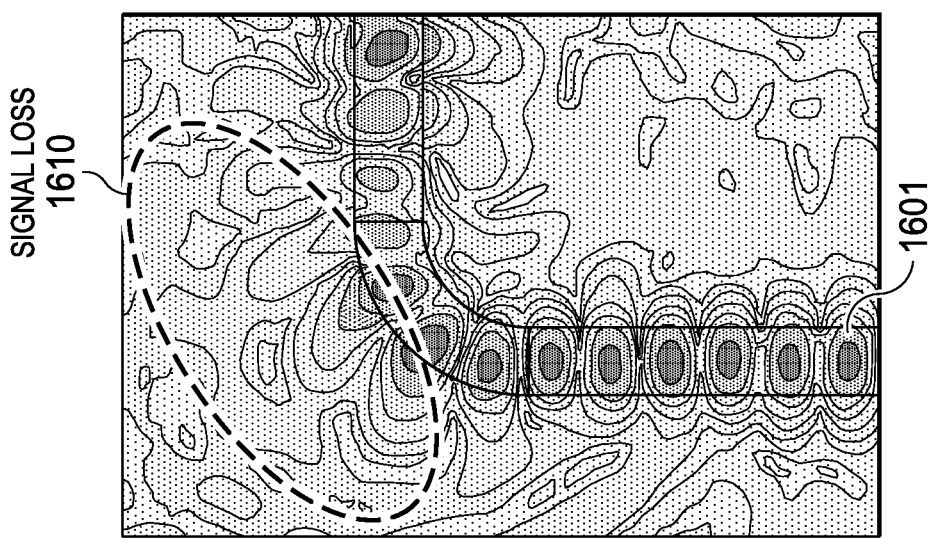

FIGS. 16A and 16B illustrate a simulation of radiated energy from a right angle corner of DWG 1601. This simulation example illustrates loss of signal in a dielectric waveguide of cross section 1×2 mm in a 90 degree corner with a radius of curvature of 2 mm. As indicated at 1610 of FIG. 16A, and 1612 of FIG. 16B, there is a significant amount of energy that is radiated out from the DWG at the outside radius of the DWG.

Figure 17:
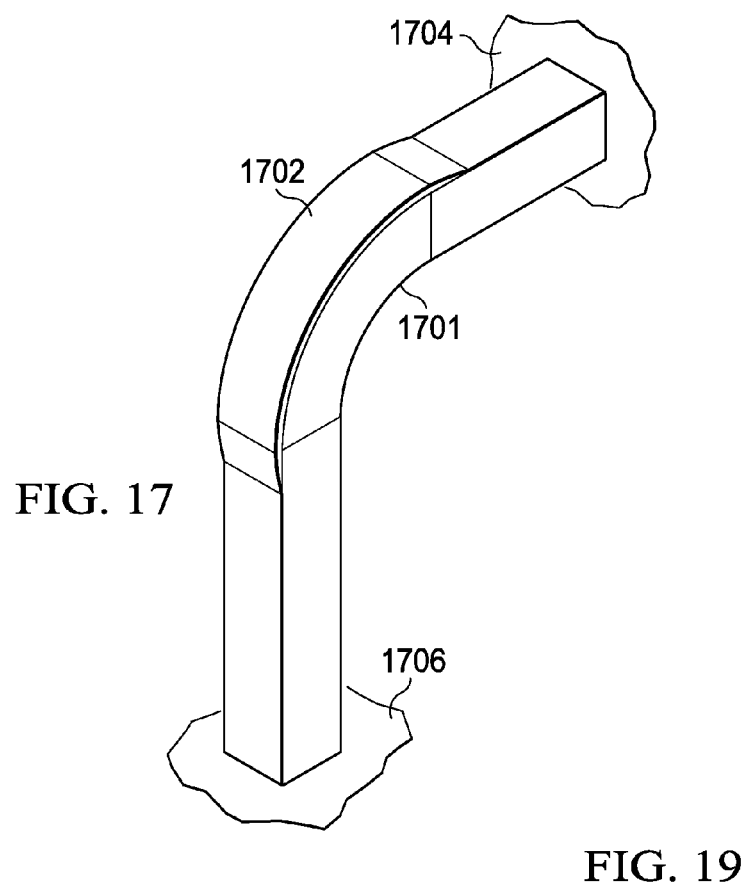
FIG. 17 is an illustration of a DWG that has a right angle corner that is shielded to minimize radiation leakage.

FIG. 17 is an illustration of a DWG 1701 that has a right angle corner that is shielded 1702 to minimize radiation leakage. DWG 1701 is an example of a dielectric waveguide with metallic plating in the outer radius wall of an abrupt corner to reduce/eliminate the electromagnetic wave that would escape the dielectric waveguide if the plated reflector is not present. In general, dielectric waveguide 1701 may be manufactured with plastic such as polypropylene, polyethylene, PMMA (Poly (methyl methacrylate), commonly referred to as Plexiglass), etc. PMMA may have a high dielectric constant value, especially when treated with ceramic fillers, for example, and can be used to form the core member of a DWG. Polypropylene and polyethylene have lower dielectric constants and may be used for cladding on the DWG. The metallic plating 1702 may be done with various metallic components, such as: copper, aluminum, gold, silver, etc.

In another embodiment, shield 1702 may be a non-metallic conductive material, such as a carbon based material or other material that provides a low electrical impedance to a sub-terahertz radiated signal.

The metallic shield 1702 may be applied to the outside of the cladding on the outside radius of the corner. In another embodiment, a metallic shield may be positioned between the core member and the cladding on an outside radius of the corner of the core member. The metallic shield may be formed by various methods, such as: a selective plating process, by affixing a metallic adhesive tape, by affixing a preformed metallic part using glue or other bonding techniques, etc.

Surfaces 1704 may represent a circuit board and surface 1706 may represent another circuit board that is coupled to circuit board 1704, for example. Circuit board 1704 may have various integrated circuits and other components mounted on it. For example, an IC package similar to 210, 240 of FIG. 2A may be mounted on it and coupled to DWG 1701. In another configuration, an electronic device such as 900, 940 may be mounted on circuit board 1706 and coupled to DWG 1701. Similarly, circuit board 1706 may have electronic devices mounted on it that are coupled to DWG 1701. In another configuration, circuit board 1706 may be a backplane that transfers a signal from DWG 1701 to another circuit board, for example.

In another example, right angle DWG 820 of FIG. 8A may be configured with a corner reflector as described herein. Thus, many combinations of circuit boards, substrates, and electronic devices may be configured to make use of a right angle DWG such as DWG 1701.

Figure 18A:
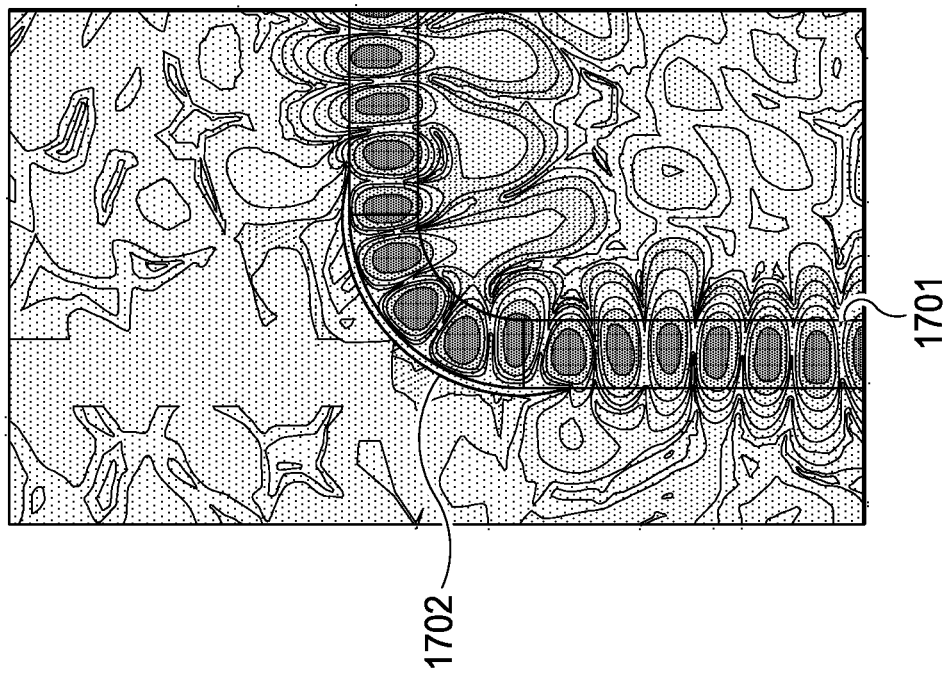
FIGS. 18A-18B illustrate a simulation of radiated energy from a shielded right angle corner of a DWG.
Figure 18B:
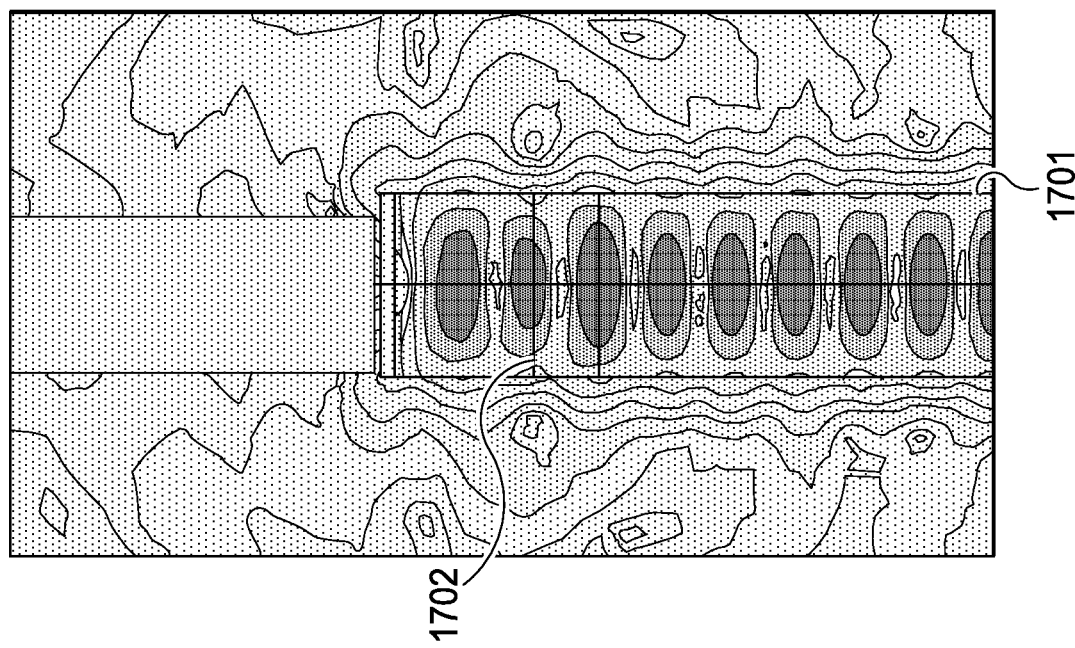

FIGS. 18A-18B illustrate a simulation of radiated energy from a shielded right angle corner of a DWG. This simulation example illustrates loss of signal in a dielectric waveguide of cross section 1×2 mm in a 90 degree corner with a radius of curvature of 2.5 mm. Notice the lack of radiated energy on the outer radius of the corner due to the presence of shield 1702.

Figure 19:
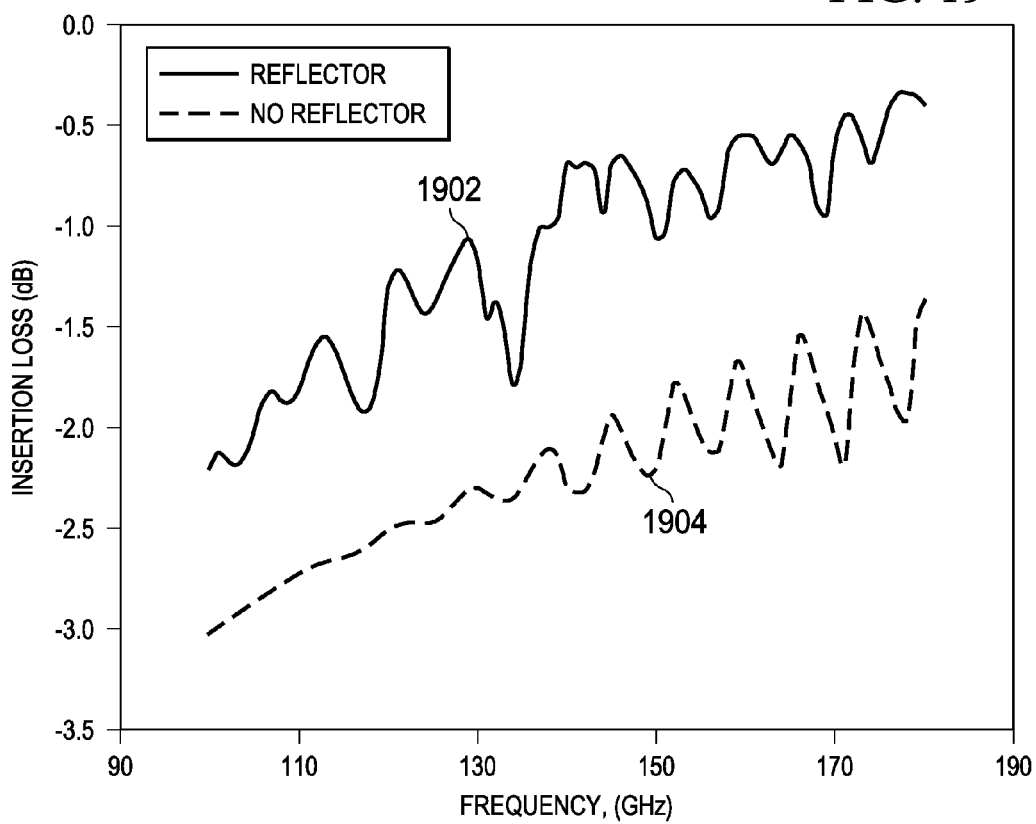
FIG. 19 is a plot illustrating insertion loss vs. frequency for a DWG with a right angle bend.

FIG. 19 is a plot illustrating insertion loss vs. frequency for a DWG with a right angle bend between the ends of the system simulated. Plot line 1902 illustrates the insertion loss for the DWG segment with a reflector on an outer radius of the corner, while plot line 1904 illustrates the insertion loss for the DWG segment without a reflector.

The plating may also be extended on the sides of the dielectric waveguide, but if all four sides are plated a metallic waveguide is created that has a frequency cutoff determined by the size of the dielectric waveguide. Below the cutoff frequency there is no propagation of the electromagnetic field.

While a corner that makes a bend of approximately 90 degrees is illustrated in this example, the same principles may be applied to bends that are larger or smaller than 90 degrees. For example, is some instances, a bend of 180 degrees may be needed, while in other instances, a bend of only 45 degrees may be needed.

In this manner, a DWG with an acute bend can be made using standard DWG materials and known fabrication techniques that provides a low insertion loss.

Figure 20:
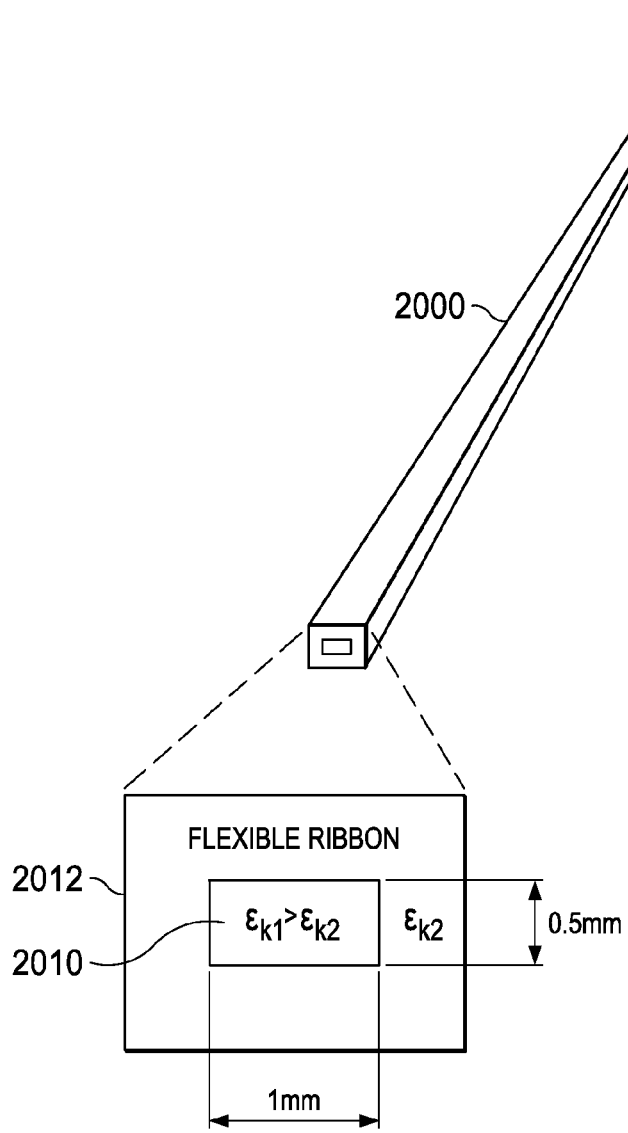
FIG. 20 is an illustration of an example flexible DWG.

FIG. 20 is an illustration of an example flexible DWG 2000. As discussed above, for point to point communications using modulated radio frequency (RF) techniques, dielectric waveguides provide a low-loss method for directing energy from a transmitter (TX) to a receiver (RX). Many configurations are possible for the waveguides themselves. A solid DWG was described above with respect to FIG. 2A, for example. Generally, a solid DWG is useful for short interconnects or longer interconnects in a stationary system. However, their rigidity may limit their use where the interconnected components may need to be moved relative to each other. A flexible waveguide configuration may have a core member made from flexible dielectric material with a high dielectric constant ($\in k1$) and be surrounded with a cladding made from flexible dielectric material with a low dielectric constant, ($\in k2$). While theoretically, air could be used in place of the cladding, since air has a dielectric constant of approximately 1.0, any contact by humans, or other objects may introduce serious impedance mismatch effects that may result in signal loss or corruption. Therefore, typically free air does not provide a suitable cladding.

FIG. 20 illustrates a flexible DWG 2000 that is configured as a thin ribbon of the core material surrounding by the cladding material. In this example, a thin rectangular ribbon of the core material 2010 is surrounded by the cladding material 2012. For sub-terahertz signals, such as in the range of 130-150 gigahertz, a core dimension of approximately 0.5 mm×1.0 mm works well. DWG 2000 may be manufactured using known extrusion techniques, for example.

Figure 21A:
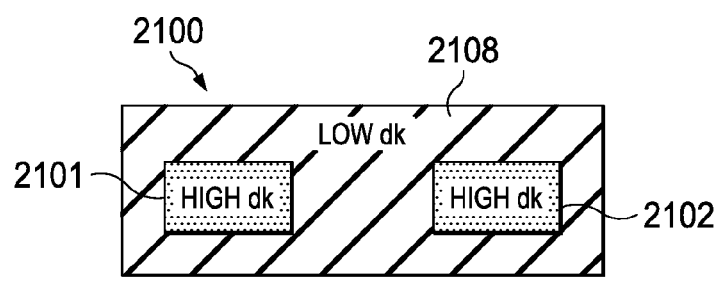
FIGS. 21A-21D illustrate various configurations of a multichannel flexible DWG.

FIGS. 21A-21D illustrate various configurations of a multichannel flexible DWG. There are many cases where a single DWG channel is not sufficient. For example, bi-directional communication may require two DWG channels. A simple dual channel DWG 2100 configuration is illustrated in FIG. 21A. In this example, two core members 2101, 2102 that have a higher $\in k1$ value are surrounded by cladding 2108 that has a lower $\in k2$ value. This ribbon cable like configuration may be easily expanded to provide any number of multiple channels.

However, such a configuration is not always desired. As the number of DWG "channels" increases, the width of the ribbon tends to increase which may not be desirable for some applications. In addition, the waveguides themselves in a ribbon configuration are configured in an arrangement where crosstalk between adjacent waveguide channels may be intrusive, since all waveguides are essentially in the same plane. In order to alleviate the potential crosstalk problem, the channel spacing may be increased or shielding may need to be added.

Another way to overcome crosstalk will now be described. This solution provides a convenient geometrical solution to the problem of how to build multiple waveguides in a cable assembly. While the implementations illustrated here are intended for flexible cable applications, these geometrical solutions may also be used in rigid waveguide assemblies.

Figure 21B:
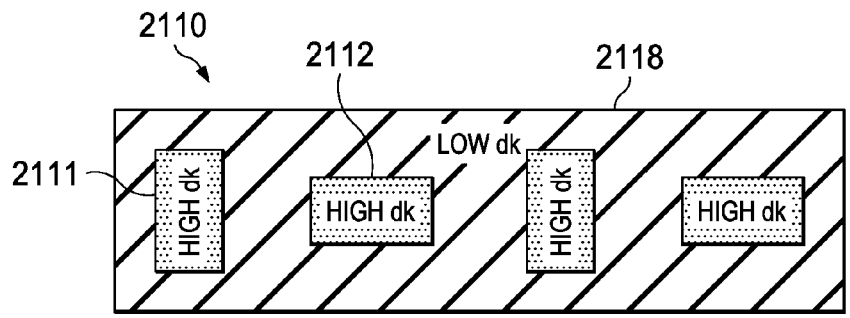

FIG. 21B illustrates a ribbon style cable 2110 in which multiple channels are arranged as close as possible to reduce the physical size of the cable in order to reduce manufacturing costs and increase the interconnect density. In this example, the adjacent DWG core members, such as 2111, 2112, are arranged in an alternating horizontal and vertical pattern of high $\in k1$ ribbons surrounded by the cladding material 2118. While four channels are illustrated here, two, three, or more than four channels may be implemented in the same ribbon by positioning the multiple channels orthogonally to each other as illustrated in FIG. 21B. This "polarized" ribbon configuration provides maximum isolation between the adjacent channels without requiring an increase in the channel spacing or addition of any shielding between the channels.

Figure 21C:
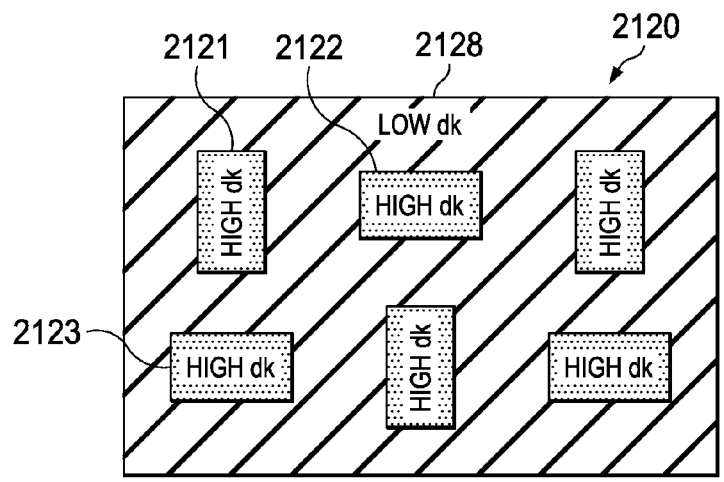

FIG. 21C illustrates a stacked multiple channel DWG cable 2120. In this example, two rows of core members are stacked, as indicated at 2121-2123 and surrounded by cladding 2128. All of the core members are positioned orthogonally to each other to minimize crosstalk. In this example, the cladding has a generally rectangular cross sectional shape.

Figure 21D:
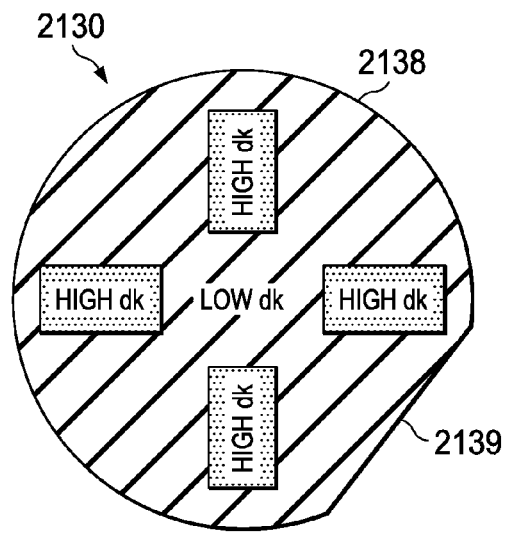

FIG. 21D illustrates a multiple channel DWG cable 2130 in which the cladding 2138 has a generally circular cross sectional shape. In this case, a round cable assembly is used and the ribbons of high $\in k1$ material are completely surrounded by a cladding of low $\in k1$ material. Note that the multiple core member ribbons, such as 2131, are positioned orthogonally to each other to reduce cross talk.

In the examples described above, the waveguides themselves are configured orthogonally to one another and arranged such that the spacing between the high $\in k1$ "channels" is maximized. This configuration minimizes crosstalk between the channels since the RF energy on each waveguide is polarized. RF energy with 90 degree polarization does not interfere with another channel. Therefore, by rotating the channels at a 90 degree arrangement to each other, the spacing between channels of the same polarity is maximized. Channels that have the opposite polarization mode may be spaced tighter since their interference is minimized.

FIG. 21D also illustrates a flattened area 2139 that may serve as a key. In any of the implementations described above, the cable may be "keyed" in order to provide positive alignment. In the case of the rectangular ribbons, a key may be added by flattening a corner, for example. Other common keying techniques can be applied, such as a notched cable, adding ribbing to the exterior cladding, etc.

While the multiple dielectric cores are illustrated as being approximately the same size, in some embodiments there may be differences in the size of one or more cores in order to optimize transmission efficiency for RF signals that have significantly different wavelengths. As frequency increases, wave length decreases and the physical size of the dielectric core may also be reduced for higher frequency signals.

The flexible cables described above may be fabricated using standard manufacturing materials and fabrication techniques. These cable geometries may be built using drawing, extrusion, or fusing processes, which are all common-place to the manufacture of plastics.

However, there are many cases where a flexible DWG alone is not sufficient for an interface between two components. For example, the DWG by nature is an insulator. While it can efficiently guide high frequency RF signals, delivering appreciable levels of power is not possible. It may be desirable in many cases to provide both a DC or low frequency traditional conductive wire solution in combination with a high frequency communication path afforded by one or more flexible DWGs.

In another example, it may be desirable to include a DWG within an existing type of cabling system. For example, USB is a commonplace interconnect that provides data at 12 MBps (USB1.1), 480 Mbps (USB2.0) and 5.0 Gbps (USB3.0) using high speed conductive cabling and in addition provides power from a host device to a peripheral device. Inclusion of a DWG in a USB would allow the same cable to be used for MBps (megabit per second) and for sub-terahertz data communication. Another example is the common power cord connecting a PC (laptop, pad, tablet, phone, etc) to a power source. This can either be the AC lines in the case of a PC or to a DC power supply. Inclusion of a DWG with the power cable may allow using the power cable to supply power and also to provide high speed data transfer to a network connection that is included with the power system of a building, for example.

An aspect these examples all have in common is that an existing cable or otherwise required cable is always covered by a dielectric material to insulate and shield the inner metallic conductors. A combined cable system may exploit the outer insulator as a portion of the cladding material for the DWG. By selecting an appropriate low $\in$k2 material, this insulator will provide both the needed shielding for the inner cabling as well as the proper dielectric constant needed for confining the RF energy in the high dielectric constant core material.

Figure 22:
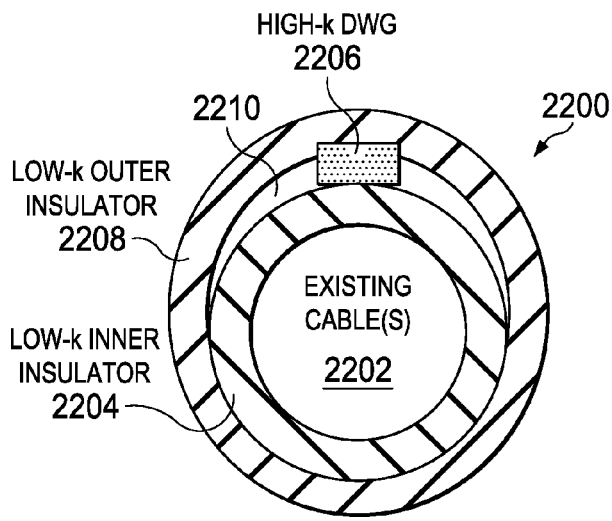
FIGS. 22-25 illustrate various ways of combing a flexible DWG with a flexible cable.

FIGS. 22-25 illustrate various ways of combining a flexible DWG with a flexible metallic cable. FIG. 22 illustrates a communication cable 2200 with one or more conductive wires 2202 surrounded by a dielectric sheath 2204. The sheath member has a low dielectric constant value, such as in the range of 2.5-4.5, for example. A dielectric core member 2206 is placed longitudinally adjacent to and in contact with an outer surface of sheath member 2204. The core member has a higher dielectric constant value that is higher than the first dielectric constant value, such as in the range of 3-12, for example. In this example, the dielectric core member may have a rectangular cross section, approximately 0.5 mm×1.0 mm that is suitable for sub-terahertz waves, such as approx 80-200 GHz.

A cladding 2208 surrounds sheath member 2204 and dielectric core member 2206. The cladding has a dielectric constant ($\in$k) value that is lower than the core dielectric constant value, and may be similar in value to the sheath dielectric constant. In this manner, a dielectric wave guide is formed by the dielectric core member. There may be a region indicated at 2210 that includes air, or this region may be filled by deformation of the cladding or by other filler material that has a low dielectric constant.

Figure 23:
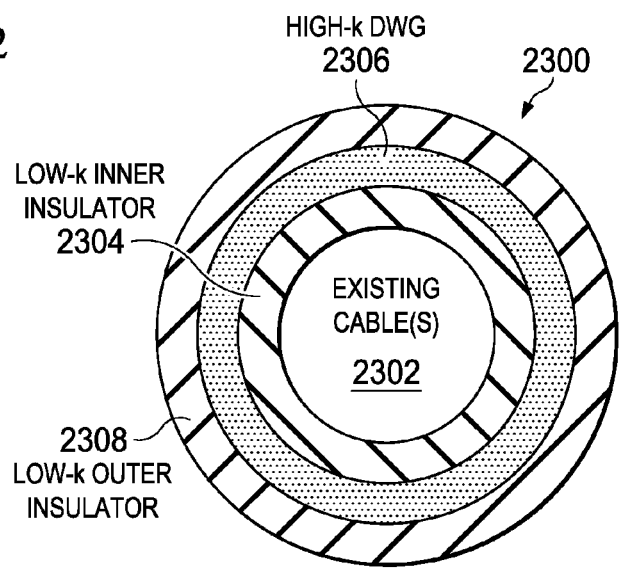

FIG. 23 illustrates a communication cable 2300 with one or more conductive wires 2302 surrounded by a dielectric sheath 2304. In this example, a single layer of insulation on a metallic cable is replaced with an outer "sandwich" of three layers. The sheath member has a low $\in$k2 value, such as in the range of 2.5-4.5, for example. A dielectric core member 2306 is placed longitudinally adjacent to and in contact with an outer surface of sheath member 2304. The core member has a higher $\in$k1 value that is higher than the first dielectric constant value, such as in the range of 3-12, for example. In this example, the dielectric core member 2306 completely surrounds the dielectric sheath 2304. A thickness of approximately 0.5 mm thick that is suitable for sub-terahertz waves, such as approx 80-200 GHz. A third layer of cladding 2308 surrounds sheath member 2204 and dielectric core member 2306. The cladding has a lower $\in$k3 value that is lower than the core dielectric constant value, and may be similar in value to the sheath dielectric constant. In this manner, a dielectric wave guide is formed by the dielectric core member. This technique may be expanded to include additional alternating layers of the $\in$k2 and $\in$k1 materials in order to provide additional waveguides.

Figure 24:
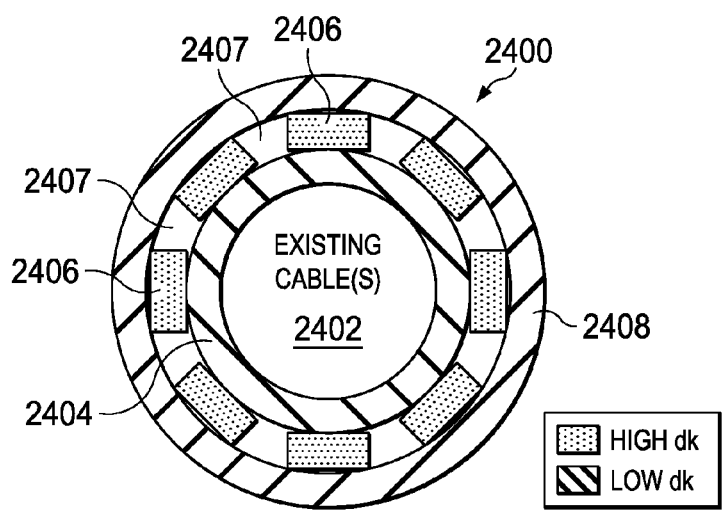

FIG. 24 illustrates another flexible communication cable 2400. In this example, many dielectric waveguides may be embedded in the insulators surrounding conductor cable(s) 2402. Multiple dielectric core members 2406 that have a higher $\in$k1 value are placed adjacent to and in contact with an outer surface of the sheath member 2404 that has a low $\in$k2 value. The plurality of dielectric core members are spaced apart from each other and each have a cross section shape that is approximately rectangular. Fillers 2407 that have a lower $\in$k3 value may placed between the core members. An outer cladding 2408 that has a low $\in$k4 value is then placed around the multiple core members. $\in$k2, $\in$k3, and $\in$k4 may have similar values in the range of 2.5-4.5, for example. In this manner, multiple dielectric wave guides may be formed.

Figure 25:
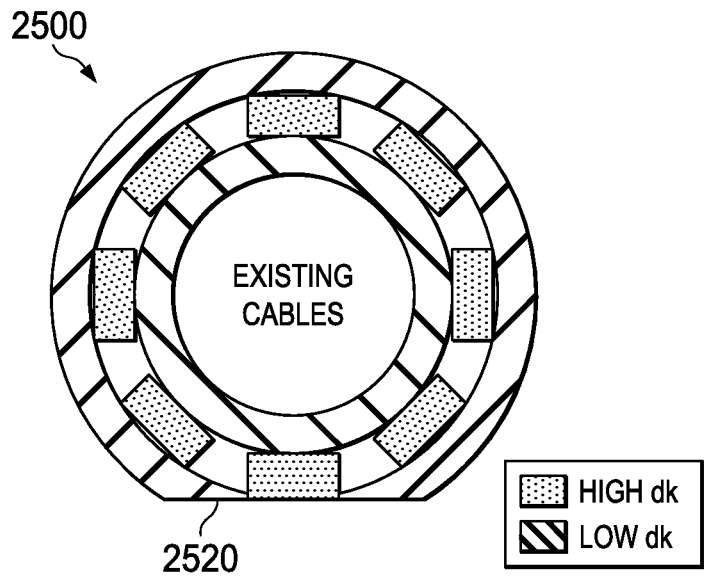

FIG. 25 illustrates a keyed cable 2500. In any of the solutions proposed above, the cable can be "keyed" in order to provide positive alignment. In this example, one side of the cable has a flattened profile 2520. Other common keying techniques can be applied, such as a notched cable, adding ribbing to the exterior cladding, etc.

The conductor cable, such as 2202, 2302, and 2402 may be a metallic wires, for example, or it may be another type of cable for conducting data or energy, such as: one or more fiber optic cable, one or more twisted pairs, such as for CAT5 wiring, co-axial cable, etc.

The flexible DWGs in the cables described above may be fabricated using standard manufacturing materials and fabrication techniques. These cable geometries may be built using drawing, extrusion, or fusing processes, which are all commonplace to the manufacture of plastics.

Figure 26:
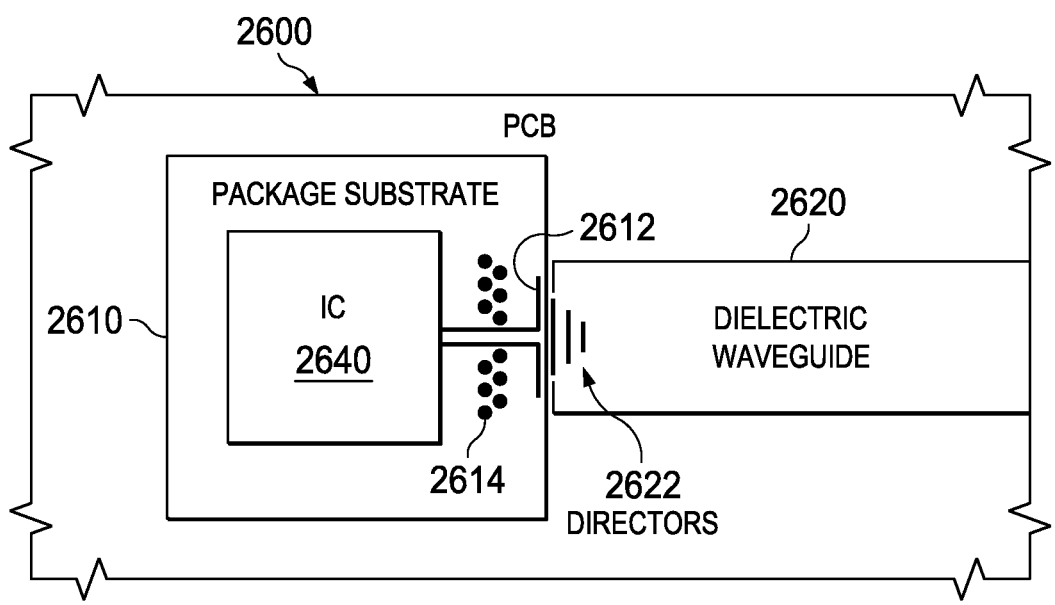
FIG. 26 illustrates a microelectronic package with a dipole antenna coupled to a DWG that has director elements to improve coupling of a radiated signal.

FIG. 26 illustrates a microelectronic package 2610 with a dipole antenna 2612 coupled to a DWG 2620 that has director elements 2622 to improve coupling of a radiated signal launched by dipole antenna 2612. An electro-magnetic RF wave (a modulated radio-frequency carrier signal) is generated by electronic circuitry contained within IC 2640 that is mounted on a substrate 2610. The RF signal is coupled into waveguide 2620 that is mechanically aligned to substrate 2610. Substrate 2610 and DWG segment 2620 may both be mounted on a PCB 2600 to hold them in alignment, for example.

As described above, a dipole antenna is a good vehicle for launching radiated energy into a dielectric waveguide. Reflector elements, such as described in more detail with regard to FIGS. 2A, 5, 6, and 8A may be used to reflect wayward energy back towards DWG 2620.

In order to further improve coupling of the radiated energy into DWG 2620, one or more director elements may be included within DWG 2620. A dipole has a toroidal radiation pattern symmetrical to the axis of the dipole. In order to increase the directivity and hence, decrease the insertion losses, reflector and director(s) elements may be added. The dipole and the reflector may reside on the same substrate 2610 as the circuitry 2640 generating the electro-magnetic wave, as described in more detail in FIGS. 2A, 5, 6, and 8A for example. The dipole and the feed-lines may be implemented in a metal layer of a multi-layered substrate, for example.

The reflector may be implemented as a staggered via-array in the substrate, as described in more detail with reference to FIGS. 5, 6, for example. Alternatively, the reflector may be implemented as a strip of metal oriented parallel to the dipole antenna, for example. The reflector strip may be grounded or it may be electrically floating. Typically, the reflector strip may be implemented on the same metal layer in which the dipole antenna is implemented. Spacing the metal reflector structure approximately one half of a wavelength from the dipole antenna provides an optimum amount of reflection. Alternatively, the reflector structure may be placed a distance of 1.5, 2.5, etc wavelengths from the dipole antenna. While a distance of one half wavelength is optimum, a distance in the range of 0.3-0.7 or multiples thereof provides a useful amount of reflection. Since skin effect predominates at sub-terahertz frequencies, the thickness of the metal reflector element is not critical.

The director elements are similar in operation to a Yagi-Uda array commonly used in beam antennas for communication radio bands and amateur radio bands, for example. Yagi-Uda antennas are directional along the axis perpendicular to the dipole in the plane of the elements, from the reflector toward the driven element and the director(s). Typical spacing between elements may vary from about 1/10 to 1/4 of a wavelength, depending on the specific design. The lengths of the directors are typically smaller than that of the driven element, which is smaller than that of the reflector(s) according to known antenna design principles. These elements are usually parallel in one plane.

The bandwidth of a Yagi-Uda antenna refers to the frequency range over which its directional gain and impedance match are preserved to within a stated criterion. The Yagi-Uda array in its basic form is very narrowband, with its performance dropping at frequencies just a few percent above or below its design frequency. However, by using larger diameter conductors, among other techniques, the bandwidth may be substantially extended.

Since the directors are passive elements, they may therefore be embedded on the dielectric waveguide itself. Length and spacing of the elements 2622 is selected to optimize directivity and bandwidth of the structure for a given wavelength of the electromagnetic signal that is being launched or received, referred to as the RF carrier frequency. The proper spacing between the dipole and the director is maintained by the mechanical alignment provided by PCB 2600, for example.

The spacing and the length of the director elements are dependent on the wavelength and the total amount of director elements used. Generally, as more elements are used, the gain and directivity increase but the bandwidth is lowered. The design usually starts with approximate numbers using known antenna design techniques from a textbook or guidelines. For example, "Antenna Theory Analysis and Design," 1997, pages 513-532 which is incorporated by reference herein.

Numerical modeling using known simulation tools may be used to optimize the performance until requirements for a particular application are satisfied. Typically, director spacing at 0.2-0.3 times wavelength works well. A length for each director element in the range of 0.5-0.3 times wavelength works well. Typically, director array 2612 may include twelve or fewer elements.

Table 1 lists spacing and number of elements for an example array of directors 2622. Due to the high carrier frequency (>100 GHz) the dimensions of the elements given in Table 1 are rather small. However, those dimensions are based on the first resonance (close to lambda/2) and the antenna may also be designed making use of higher order resonances, such as: lambda, 3/2 lambda, etc, for example, which allow more relaxed manufacturing tolerances.

TABLE 1 example director element length and spacing
(Source: "Antenna Theory Analysis and Design," 1997. table 10.6)

| | Length of Yagi-Uda Array (in wavelength) | | | | |
|---|---|---|---|---|---|
| | 0.4 | 0.8 | 1.2 | 2.2 | 3.2 |
| Length of reflector | 0.482 | 0.482 | 0.482 | 0.482 | 0.482 |
| Length of director elements L3 | 0.442 | 0.428 | 0.428 | 0.432 | 0.428 |
| L4 | | 0.424 | 0.420 | 0.415 | 0.420 |
| L5 | | 0.428 | 0.420 | 0.407 | 0.407 |
| L6 | | | 0.428 | 0.398 | 0.398 |
| L7 | | | | 0.390 | 0.394 |
| L8 | | | | 0.390 | 0.390 |
| L9 | | | | 0.390 | 0.386 |
| L10 | | | | 0.390 | 0.386 |
| L11 | | | | 0.398 | 0.386 |
| L12 | | | | 0.407 | 0.386 |

Director elements 2612 may be molded from a metallic compound, or be plated plastic elements, for example. The set of director elements may be connected by a center beam for support and spacing and then be embedded in an end of DWG segment 2620. Typically, fewer than twelve director elements would be embedded in an end of a DWG. Since skin effect is predominate at sub-terahertz frequencies, the thickness of the metal in the director elements is not critical.

In this manner, the launching structure is split into an active "feeding" section 2612, 2614 residing on the chip's package and a passive "resonating" section 2622 residing on the waveguide 2620. The size of the launch structure is reduced since part of it is embedded in the dielectric waveguide itself.

Figure 27A:
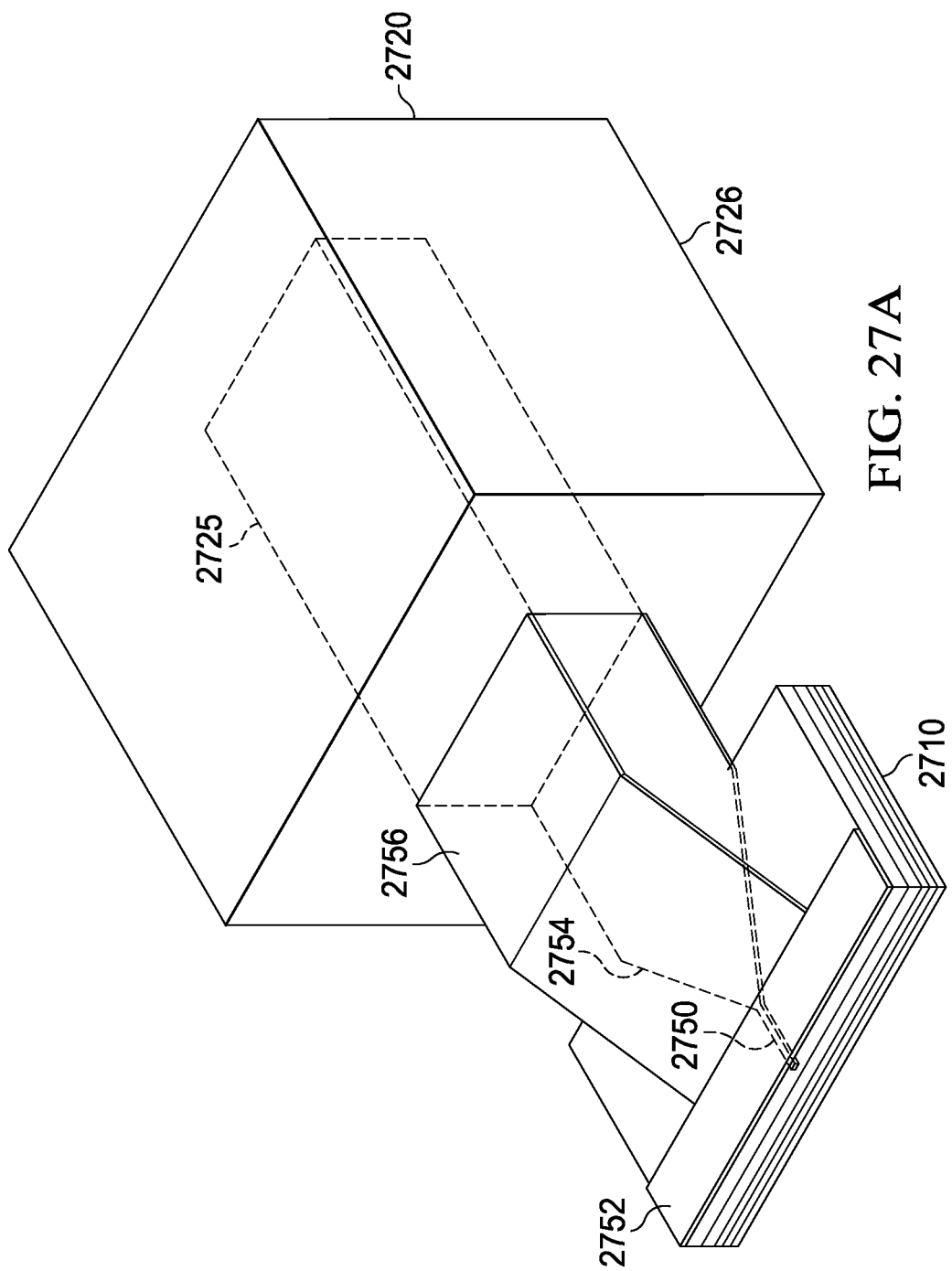
FIGS. 27A-27C are multiple views of a structure for launching a signal from a stripline to a DWG.
Figure 27B:
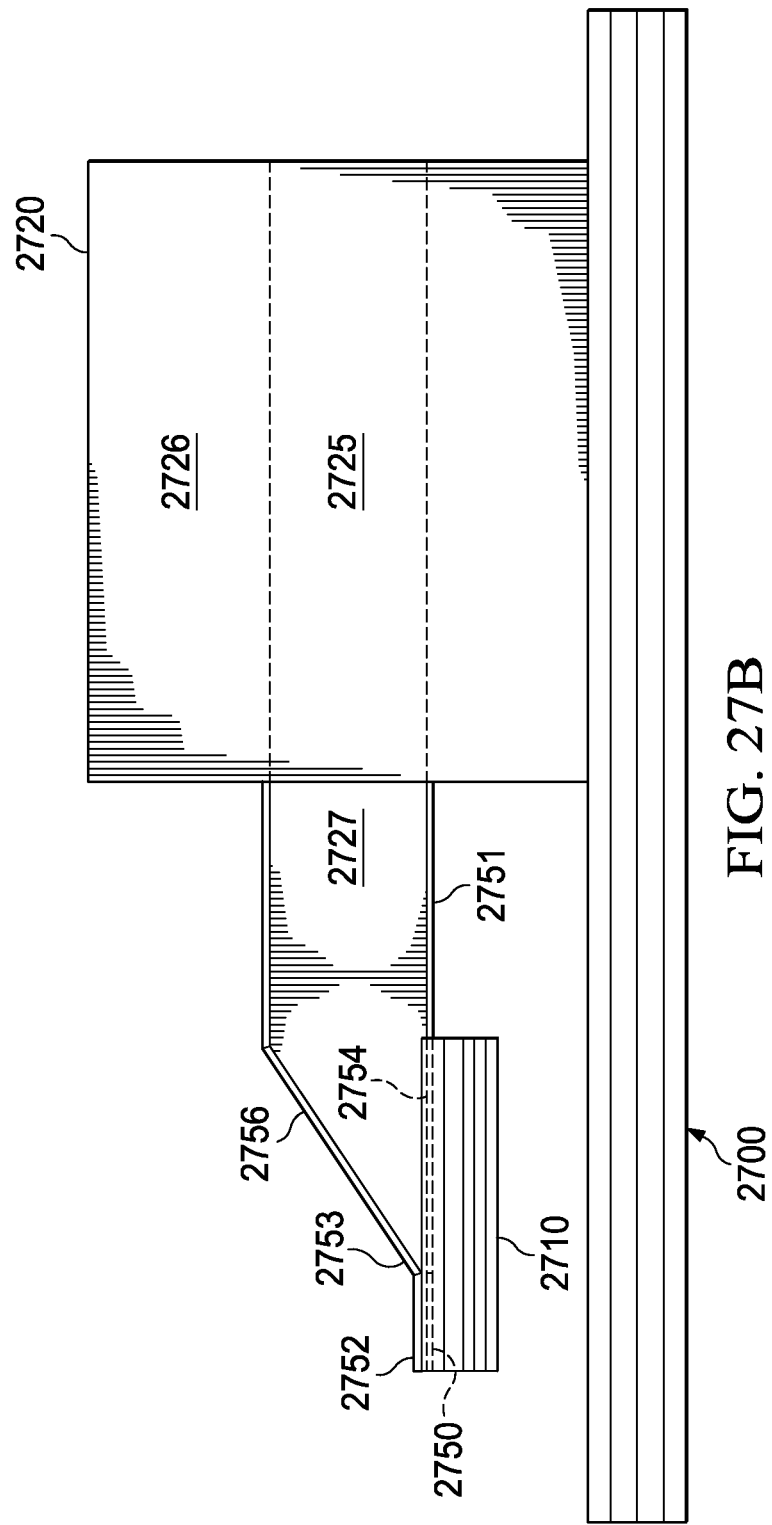
Figure 27C:
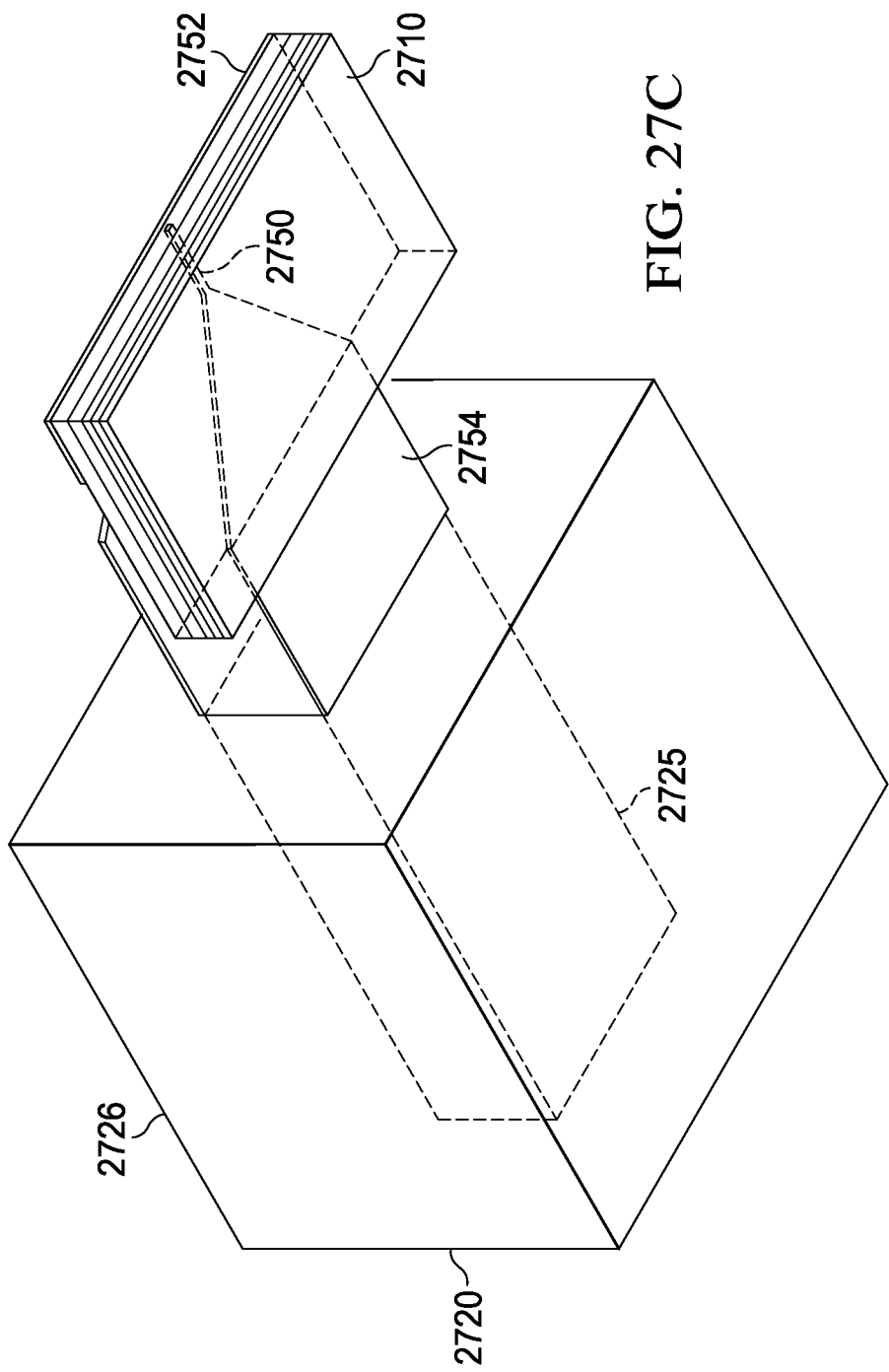

FIGS. 27A-27C are multiple views of a structure for launching a sub-THz signal from a stripline 2750 to a DWG 2720. As discussed above, launching a sub-THz electromagnetic signal from a microelectronic device to a dielectric waveguide is somewhat complex. On the other end of the dielectric waveguide the signal transported by the DWG needs to be captured from the waveguide into the microelectronic device. The use of an antenna to radiate a signal from the microelectronic device to the dielectric waveguide was described above with reference to FIGS. 2A, 5, 6, and 8A-10, for example. However, an antenna needs to be very directional and even for the best design a significant portion of the electromagnetic signal may be radiated in a direction different from the position of the DWG and therefore lost in free space. Another option will now be described; in this example, the electromagnetic signal is confined in its entire length from the silicon chip to the DWG.

FIG. 27A is an isometric view of a portion of a microelectronic device that is mounted on a substrate 2710. A transmitter or receiver in an IC (not shown) that is mounted on substrate 2710 is connected to microstrip 2750. A coupling mechanism allows the micro-strip to transition into a metallic waveguide 2756 in order to couple the IC of the microelectronic device with the dielectric waveguide 2720.

The microstrip line 2750 coming from the silicon chip has an impedance matched to the silicon die of the IC. Typically this impedance is 50 ohms. The impedance of microstrip 2750 is determined by its cross-section shape and the distance between it and ground plane 2752, as is well known. Ground plane 2752 extends under the length of microstrip 2750 and the distance between microstrip 2750 and ground plane 2752 is controlled to be uniform.

FIG. 27B is a side view illustrating in more detail how metallic waveguide 2758 is used to transition from the microstrip line to the DWG. Ground plane 2752 is connected to the top side of the metallic waveguide 2756 as indicated at 2753 and the micro-strip trace 2750 is connected to the bottom side of the metallic waveguide as indicated at 2751. As described above, dielectric waveguide 2720 has a core member made from dielectric material with a high dielectric constant ($\in$k1) and is surrounded with a cladding made from dielectric material with a low dielectric constant, ($\in$k2). The segment of DWG 2720 may be flexible or rigid material, as described above. Core member 2725 may be made from various types of dielectric materials, as described in more detail above. A polymer plastic is a typical material used for core member 2725. An extension 2727 of the dielectric core member 2725 extends inside the metallic waveguide 2756.

Typically, metallic waveguide 2756 is mounted to package substrate 2710 during assembly using a solder reflow process, for example. The polymer plastic DWG typically could not survive the temperature of the reflow process, so extension 2727 of DWG 2720 will be inserted into the metallic waveguide 2756 after the reflow process.

Notice how the thickness of the extension portion 2726 of the core member increases in a linear manner in the transition area from point 2753 to point 2751. In this region, the width of the microstrip is tapered to form a tapered microstrip segment 2754 that is illustrated in more detail in FIG. 27C. It is beneficial to linearly increase the width of the microstrip trace in order to match the impedance of the microstrip line with the impedance of the metallic waveguide 2756. Simulations have determined that an optimum taper is one that transitions from the width corresponding to 50 ohm line 2750 to the width of the metallic waveguide at the other end 2751 of the transition area.

Substrate 2710 may be mounted onto a larger substrate, such as PCB 2700, for example, by solder bumps, not shown, using a solder reflow process, for example. Dielectric waveguide 2720 may then be mounted onto PCB substrate 2700 using a mounting scheme, such as: an adhesive, a mechanical retention device, etc. Extension 2727 of the dielectric core member 2725 extends inside the metallic waveguide 2756 and fills the inside region of the metallic waveguide. In this manner, a highly efficient transfer function is produced between the microstrip line and the DWG.

Figure 28:
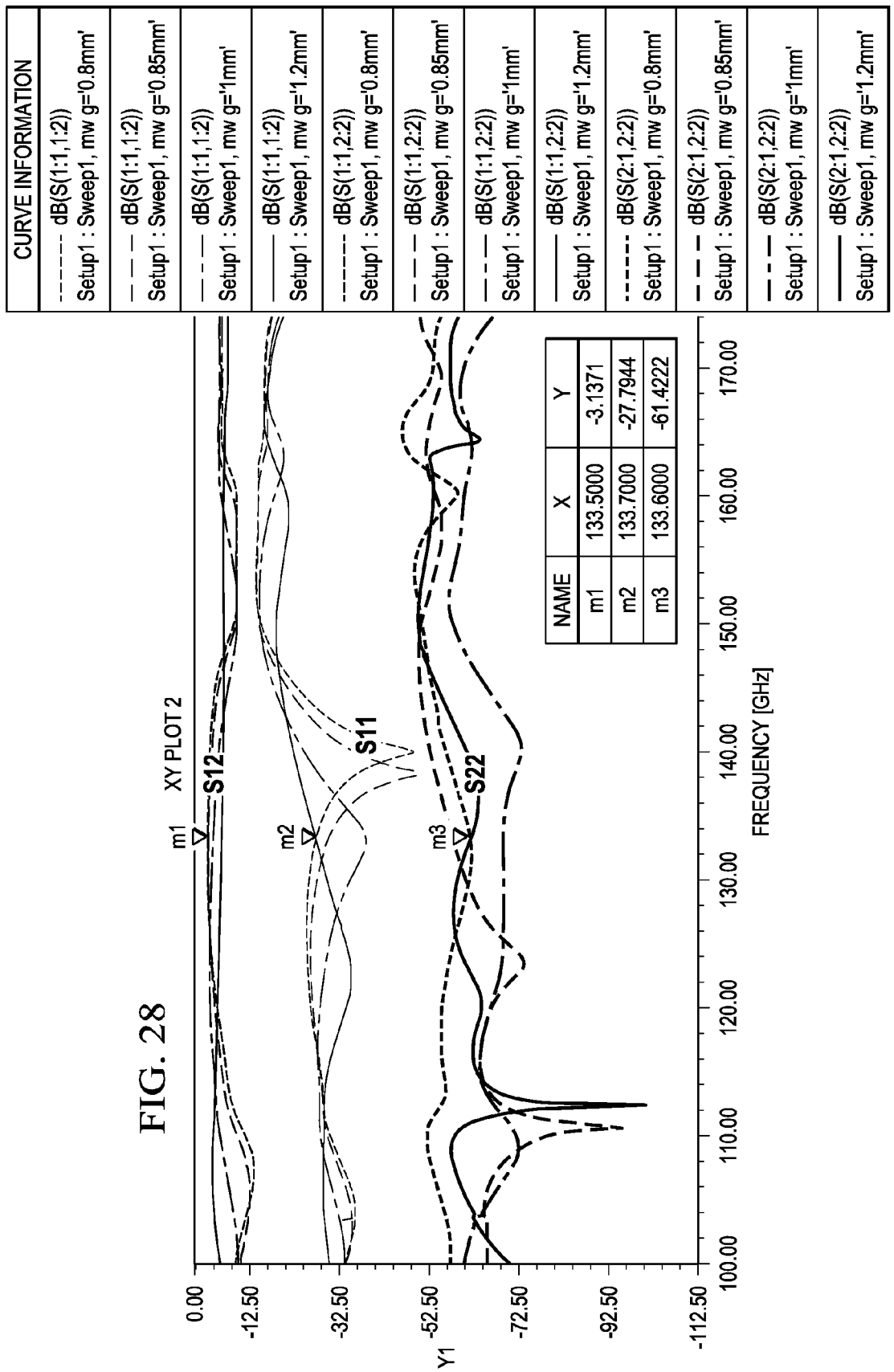
FIG. 28 illustrates simulation results for various length metallic waveguide transitions.

FIG. 28 illustrates simulation results for various length metallic waveguide transitions. These S-parameter plots were obtained from an HFSS simulation of the coupler design above. In this example, the family of curves corresponds to different lengths of the metallic waveguides. S-parameters refer to the scattering matrix ("S" in S-parameters refers to scattering). S-parameters describe the response of an N-port network to voltage signals at each port. The scattering matrix is a mathematical construct that quantifies how RF energy propagates through a multi-port network. The S-matrix is what allows the properties of a complicated network to be described as a simple "black box". For an RF signal incident on one port, some fraction of the signal bounces back out of that port, some of it scatters and exits other ports (and is perhaps even amplified), and some of it disappears as heat or even electromagnetic radiation. The first number in the subscript refers to the responding port, while the second number refers to the incident port. Thus S21 means the response at port 2 due to a signal at port 1. The three sets of parameters plotted in FIG. 28 represent the S11, S12 and S22 parameters for metallic waveguides that have a length of 0.8 mm, 0.85 mm, 1.0 mm, and 1.2 mm for frequencies from 100-180 GHz.

Figure 29:
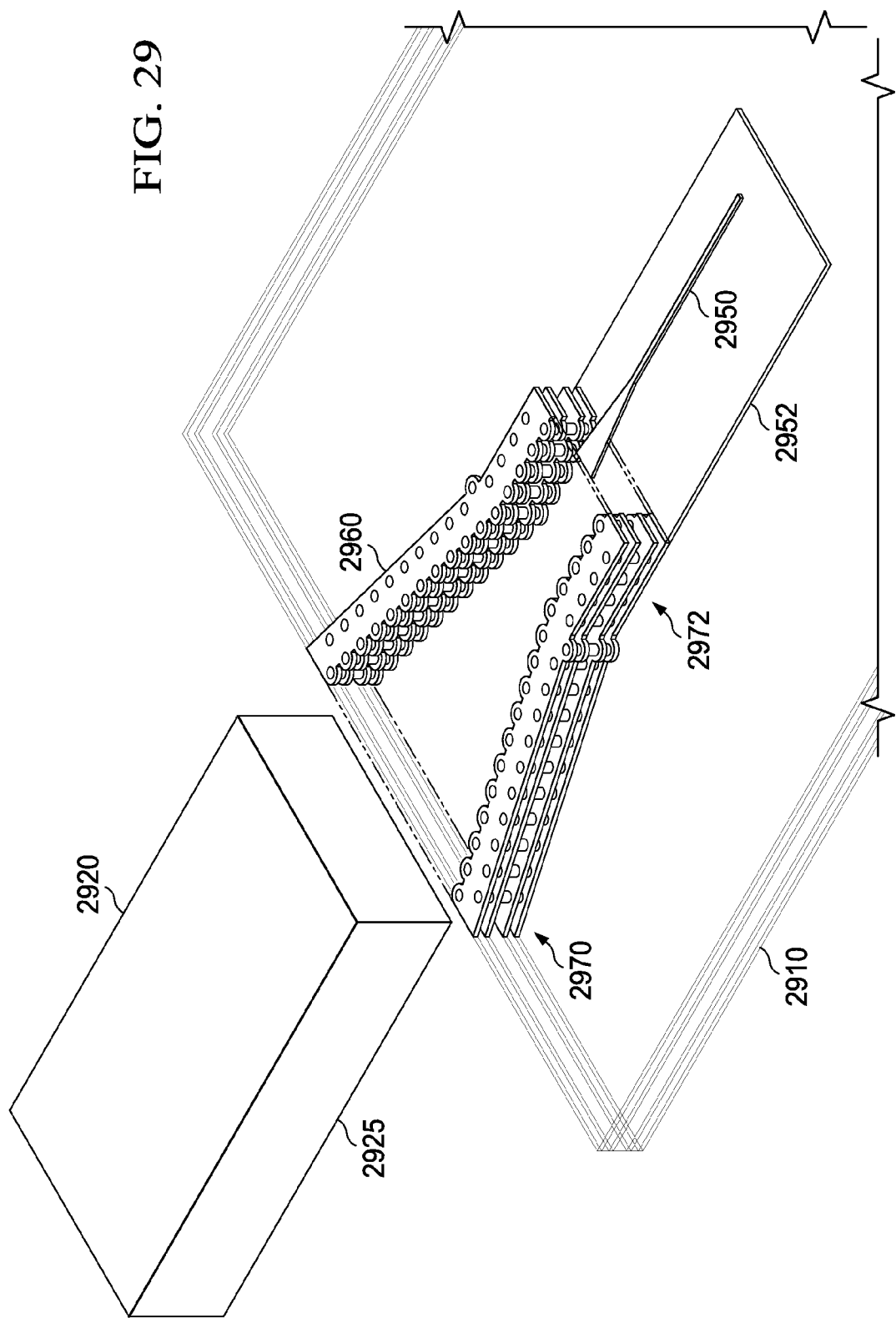
FIG. 29 is an isographic view of a horn antenna used to launch a signal from a microstrip line to a DWG.

FIG. 29 is an isographic view of a horn antenna used to launch a signal from a microstrip line to a DWG. As discussed above, launching and receiving a sub-THz electromagnetic signal from a microelectronic device to a dielectric waveguide (DWG) requires a well designed coupling scheme. While several techniques have been described above, a problem with using antennas to launch a signal into a dielectric waveguide is that, if not properly designed, a big portion of the electromagnetic signal may be lost due to radiation in directions different from where the dielectric waveguide is located.

A coupling apparatus that uses multiple copper layers within the substrate of a microelectronic package to build a horn antenna to interface with a dielectric waveguide will now be described. This apparatus is able to emit a very directional beam that is aligned with the dielectric waveguide and thereby provide an efficient energy transfer. This interface may be used to launch an electromagnetic signal from a silicon chip mounted in the same package substrate to the dielectric waveguide. The same type interface may be used at the other end of the dielectric waveguide to read the electromagnetic signal sent by the transmitter.

Referring still to FIG. 29 and to FIGS. 30A-30B, package substrate 2910 is a multilayer substrate that has multiple conductive layers 2911, typically copper, separated by layers of insulation, such as: printed circuit board material, ceramic material, etc, for example. As is well known, conductive layers in a multilayer substrate may be patterned during fabrication of the multilayer substrate to form various conductive shapes and interconnect wire patterns.

Horn antenna 2960 has a generally trapezoidal, or horn shaped top plate 2961 and bottom plate 2962 formed in different layers of the multilayer substrate 2910 with a set of densely spaced vias 2962 forming two sidewalls of the horn antenna by coupling adjacent edges of the top plate and the bottom plate. The horn antenna has a narrow input end 2972 and a wider flare end 2970. A portion 2973 of the input end may be configured as a rectangular metallic waveguide. Metallic waveguide 2973 provides an interface between microstrip line 2950 and horn antenna 2960. In other implementations, a horn antenna may interface to the microstrip line using a different type of feed mechanism. However, a rectangular metallic waveguide is convenient and easy to implement in the multilayer substrate.

A microstrip line 2950 is coupled to the top plate and a ground plane element 2952 is coupled to the bottom plate at the input end of the waveguide. Microstrip line 2950 is positioned above ground plane element 2952 and has a geometric cross section that is designed to produce an approximately uniform transmission line impedance, typically approximately 50 ohms. Of course, the cross section shape and the amount of separation between the microstrip line and the ground plane element may be varied to produce a different impedance to match a particular transmitter amplifier or receiver low noise amplifier.

To form the horn antenna and the rectangular waveguide, a tight array of staggered vias 2962 forms the vertical sidewalls of the horn antenna and waveguide. In addition, a set of filament lines 2963 may be formed in the multilayer substrate in each intermediate copper layer between the top and the bottom layer and used to join the vias at each copper level to improve the reflective characteristic of the via walls. The number of filaments is determined by the number of conductive layers in the multilayer substrate 2910. In this example there or five layers available for filament lines 2963. Other embodiments may have fewer or more. More filaments are preferred from a performance view in order to approximate a solid wall as much as the substrate manufacturing rules would allow. However, the number depends on the availability of various substrate layer thicknesses. Typically the goal is to minimize cost, so fewer layers, just enough to provide the required performance and function, may be a design goal. Each filament may be just wide enough to interconnect the staggered row of vias on a given side, or they may be as wide as the staggered row of vias, for example. In another embodiment, one or more filament lines may be part of a larger ground plane that extends beyond the horn antenna and waveguide, however, the filament lines should not intrude into the interior portion of the horn antenna and waveguide.

Microstrip line 2950 may have a tapered section 2951 that increases in width as it approaches the horn antenna. Tapered section 2951 provides impedance matching to match the impedance of the microstrip line to that of the substrate-integrated rectangular waveguide that feeds the substrate-integrated sectoral horn antenna. The taper provides an impedance match over a broad frequency band.

The microstrip line may be on the same conductive layer as the top of the horn, as illustrated in this example; however, it does not have to. It may be on an inner layer that is then connected to the top of the horn by a via where the microstrip flare connects to the rectangular waveguide. When the microstrip line is on an inner layer, it should not run through the inside of the rectangular waveguide and the horn since that would change the wave propagation properties of the whole rectangular-waveguide/horn antenna structure. The intent is to smoothly transition from the microstrip line medium of wave propagation, then into the rectangular waveguide medium of wave propagation, and ultimately radiate the field out of the horn antenna.

The ground strip element is coupled to the bottom plate 2962 to minimize wave propagation discontinuity between the microstrip line and the rectangular waveguide/horn antenna structure.

The horn antenna lateral dimensions (the flare angle, the horn length, the flare width) are chosen to provide an end-fire radiation with very low back lobes and with an optimized gain. In free-space the longer the horn the higher the gain, but in a lossy substrate the long horn suffers from high substrate. Therefore, in order to minimize loss, horn length and exact dimensions are selected to achieve a higher gain without minimal loses based on the frequency of operation and the material used to fabricate the multilayer substrate. Typically, the interior material of the horn may be PCB/PWB substrate or IC package substrate material. An initial set of dimensions may be selected based on known antenna analysis techniques. Simulation, as described above, may then be used to refine the dimensions for a particular operating frequency and substrate materials, for example.

The horn antenna height is chosen to support the required rectangular waveguide cut-off frequency for the dominant mode, which in this case is TE10. The height of the horn is also constrained by the thickness of multilayer substrate 2910. However the distance between the top and the bottom is, in this example, limited by the distance between the top Cu layer and the bottom Cu layer. The dimensions of the waveguide determine the cutoff frequency, therefore, a design constraint is that the distance between the top and bottom plates provide a cutoff frequency above an expected frequency of operation.

Substrate 2910 may be mounted onto a larger substrate, such as PCB 2900, for example, by solder bumps, not shown, using a solder reflow process, for example. Dielectric waveguide 2720 may then be mounted onto PCB substrate 2700 using a mounting scheme, such as: an adhesive, a mechanical retention device, etc. In this manner, a highly efficient transfer function is produced between the microstrip line and the DWG.

Figure 31:
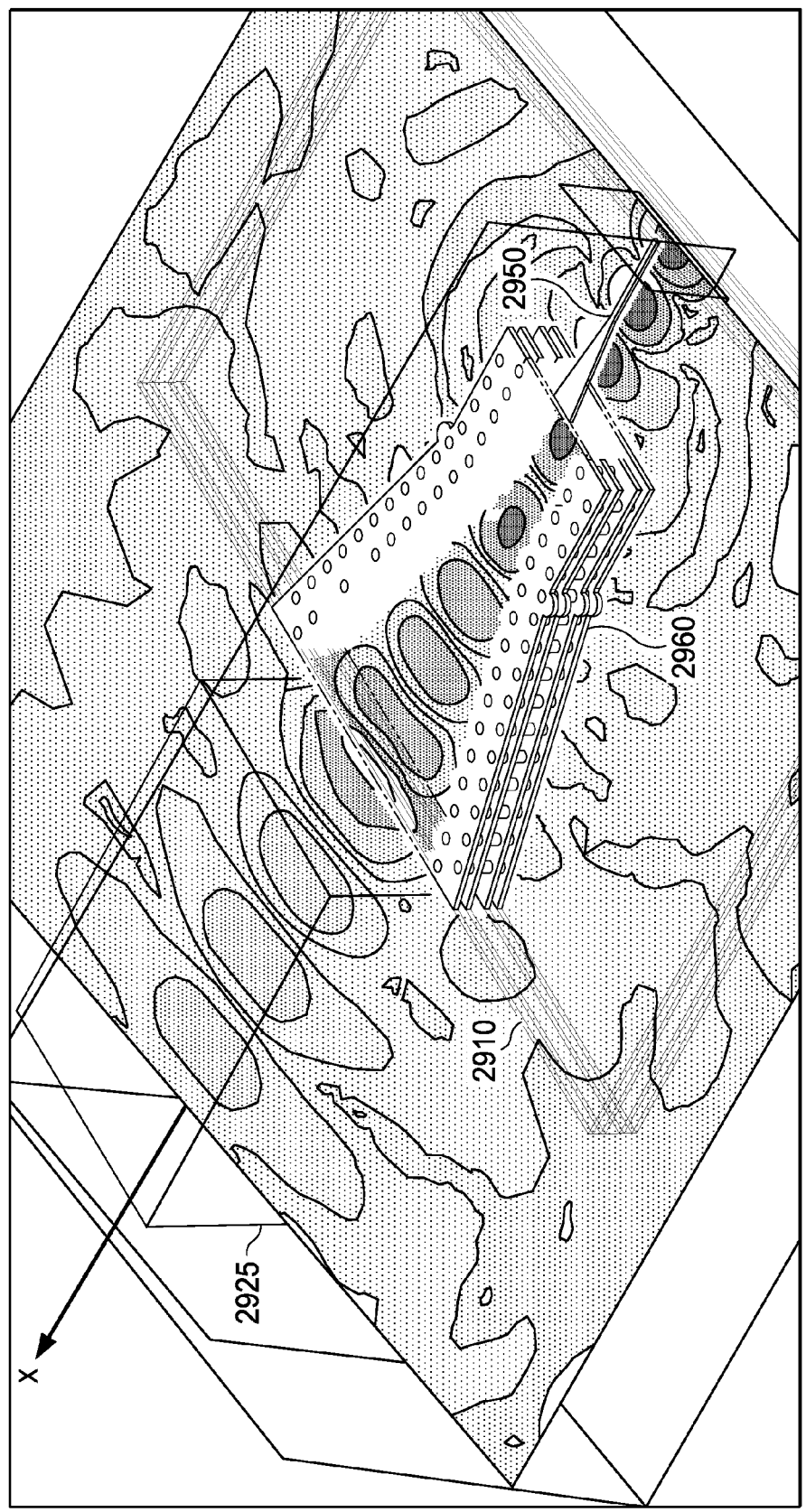
FIG. 31 illustrates a simulation of signal radiation from the horn antenna of FIG. 29.

FIG. 31 illustrates a simulation of signal radiation from the horn antenna of FIG. 29. This electromagnetic simulation was performed using the Ansys HFSS simulator. As can be seen in the illustration, a signal that is launched from the micro-strip line 2950 is launched into core member 2925 or DWG 2920 with minimal radiation loss. The beam out of horn antenna 2960 is very narrow with high directivity that is easy to focus into the DWG core.

Figure 32:
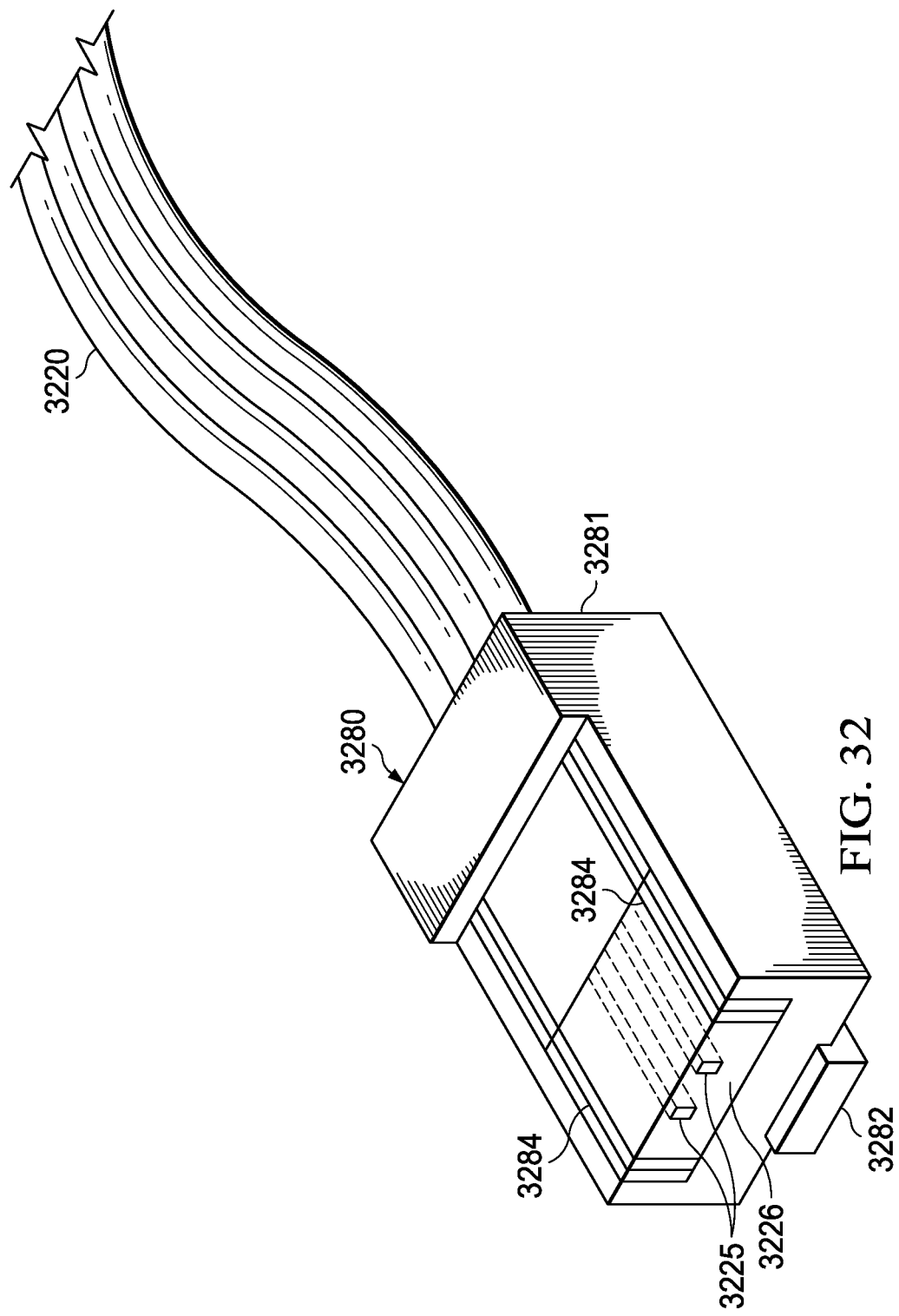
FIG. 32 illustrates use of an RJ45 connector for coupling a DWG.

FIG. 32 illustrates use of an RJ45 connector 3280 for coupling a DWG 3220 to a compatible receptacle. Based on the descriptions above of various ways to interface segments of DWG, some sort of mechanical coupling is generally required to maintain the ends of two DWG segments in proper alignment. The connection should be easy to establish, reliable, and pluggable. The connector must satisfy the tolerances for mechanical alignment of the waveguides. One example mechanical connector was illustrated in FIG. 15. Another option will now be described.

The RJ45 connector is widely used for Ethernet networking applications. In its well known form, it may have up to four wire pairs (8 wires total) for electrical data transmission. Example RJ45 connector 3280 incorporates one or more waveguides into a standardized RJ45 connector body.

In order to maintain the same footprint as a standard RJ45 connector, some or all of the electrical contacts are removed to provide room for dielectric waveguides. Since the dielectric waveguide is inherently isolating, a few electrical contacts 3284 may be retained for providing power for external periphery, for example. The electrical contacts may be coupled to wires that are included with DWG 3220 as described above in more detail with regard to FIGS. 22-24, for example. Similarly, one or more DWG cores illustrated in cable 2110 of FIG. 21 may be replaced with a copper or other conductive wire or twisted pair of wires. The electrical connectors may be coupled to the wires using the known crimp technology used in standard RJ45 connectors.

RJ45 coupler 3280 has a dielectric connector housing 3281. It may have a locking tab 3282 to interlock with a matching receptacle. DWG 3220 may have a single core, or multiple cores, as described in more detail above. DWG 3220 will typically be flexible, but it may also be rigid, as described with respect to FIG. 2B, 3, for example.

A flexible waveguide configuration may have a core member 3225 made from flexible dielectric material with a high dielectric constant ($\in$k1) and be surrounded with a cladding 3226 made from flexible dielectric material with a low dielectric constant, ($\in$k2). While theoretically, air could be used in place of the cladding, since air has a dielectric constant of approximately 1.0, any contact by humans, or other objects may introduce serious impedance mismatch effects that may result in signal loss or corruption. Therefore, typically free air does not provide a suitable cladding.

The ends of core members 3225 may be flat, or they may have a spear shape or conical shape, as described above in more detail with respect to FIG. 12, for example. A deformable gap filling material may also be included in the end of DWG 3220, as described in more detail with respect to FIG. 13, for example.

Connector housing 3281 may be attached to DWG 3220 using an adhesive or other bonding material, for example. When electrical contacts are crimped to wires that are included with DWG 3220, then that alone may be sufficient to retain DWG 3220 within connector housing 3281.

In this manner, a low cost, easy to implement, mechanically self-aligning coupling scheme is provided.

FIGS. 33-34 illustrates various applications of an RJ45 connector for coupling a DWG. FIG. 33 illustrates an electronic system that may include a PCB or other base substrate 3300. An integrated circuit 3340 that include sub-THz transmission or receiver circuitry may be mounted on a carrier substrate 3310 and coupled to a DWG segment 3320 using any of the techniques described above in more detail. A female RJ45 connecter 3385 may also be mounted on base carrier 3320 and coupled to DWG 3320, in a similar manner as described with regard to FIG. 32. The ends of the core members in DWG 3320 may be flat, or they may have a spear shape or conical shape, as described above in more detail with respect to FIG. 12, for example. A deformable gap filling material may also be included in the end of DWG 3220, as described in more detail with respect to FIG. 13, for example. Female RJ45 connector may also include electrical contacts for mating with electrical contacts 3284, for example. Male RJ45 connector 3280 may then be easily inserted into connector 3385 for a positive mechanical and signal connection.

Similarly, a female RJ45 connector 3485 may be affixed to a flexible or rigid DWG segment 3420. The ends of the core members in DWG 3420 may be flat, or they may have a spear shape or conical shape, as described above in more detail with respect to FIG. 12, for example. A deformable gap filling material may also be included in the end of DWG 3420, as described in more detail with respect to FIG. 13, for example. In this manner, two flexible or rigid DWGs may be easily and quickly mated.

Figure 35:
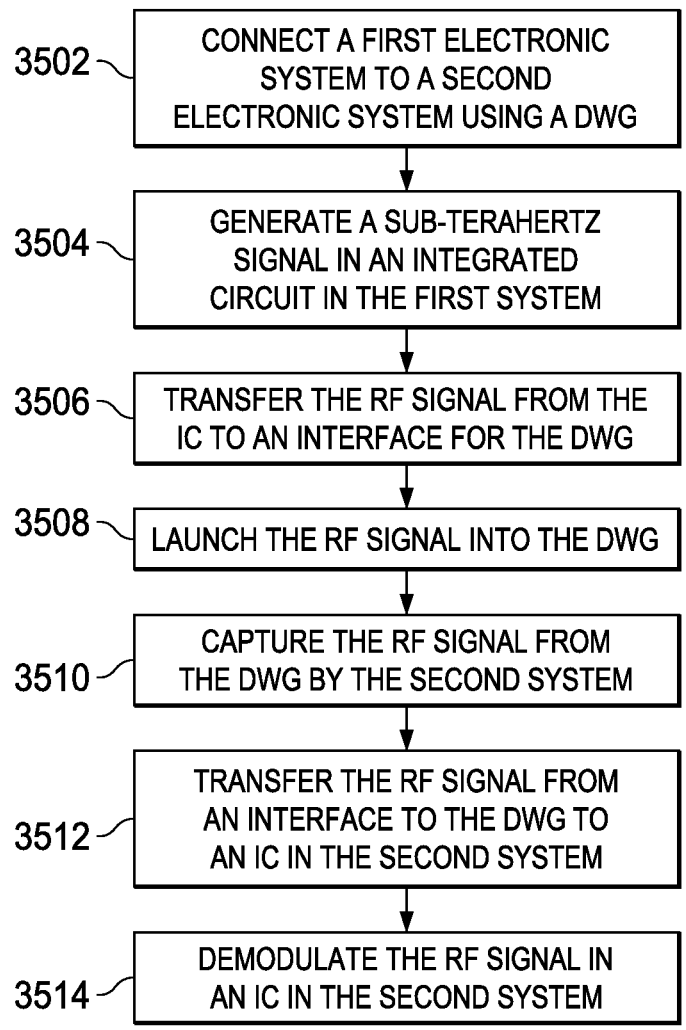
FIG. 35 is a flow chart illustrating use of a DWG in a system.

FIG. 35 is a flow chart illustrating use of a dielectric waveguide in a system. A system integrator or a system user may connect 3502 a first electronic system to a second electronic system using a DWG. The two systems may be simply two different ICs that may be part of larger system, for example, that is being assembled by a system integrator. The two systems may be a computing device and a peripheral device or two computing devices that a user is connecting together for personal or business use, for example. The systems may be any form of computing device, such as, but not limited to: a rack mount, desk mount, or portable computer, a mobile user device such a notebook computer, a tablet computer, a smart phone, etc, for example. The systems may be any type of peripheral device such as: a media storage device such as rotating or solid state disk drive, a modem or other interface to a high speed network, etc, for example.

The DWG may be any form of flexible of rigid DWG as described in more detail above, for example. The DWG may be a combination cable as described above, such as an enhanced USB cable that includes a DWG, for example. The connection may use an RJ45 connector, as described in more detail above. There may be a single DWG, or there may be multiple DWGs, depending on the requirements of the systems.

Once the system are connected and turned on, a sub-terahertz RF signal may be generated 3504 by an IC in the first system. A stream or multiple streams of data may be modulated onto the RF signal using known modulation techniques. The RF signal is then transferred 3506 from the IC and launched 3508 into the DWG using any of the coupling techniques described in more detail herein.

The second system may then capture 3510 the radiated RF signal from the DWG and transfer 3512 the captured RF signal using any of the coupling techniques described in more detail herein. An IC within the second system may then demodulate the RF signal to recover the one or more streams of data for use within the second system.

Two DWGs may be used for bidirectional transfer of data, or a single DWG may be used by providing transceivers in each of the two systems.

Figure 36:
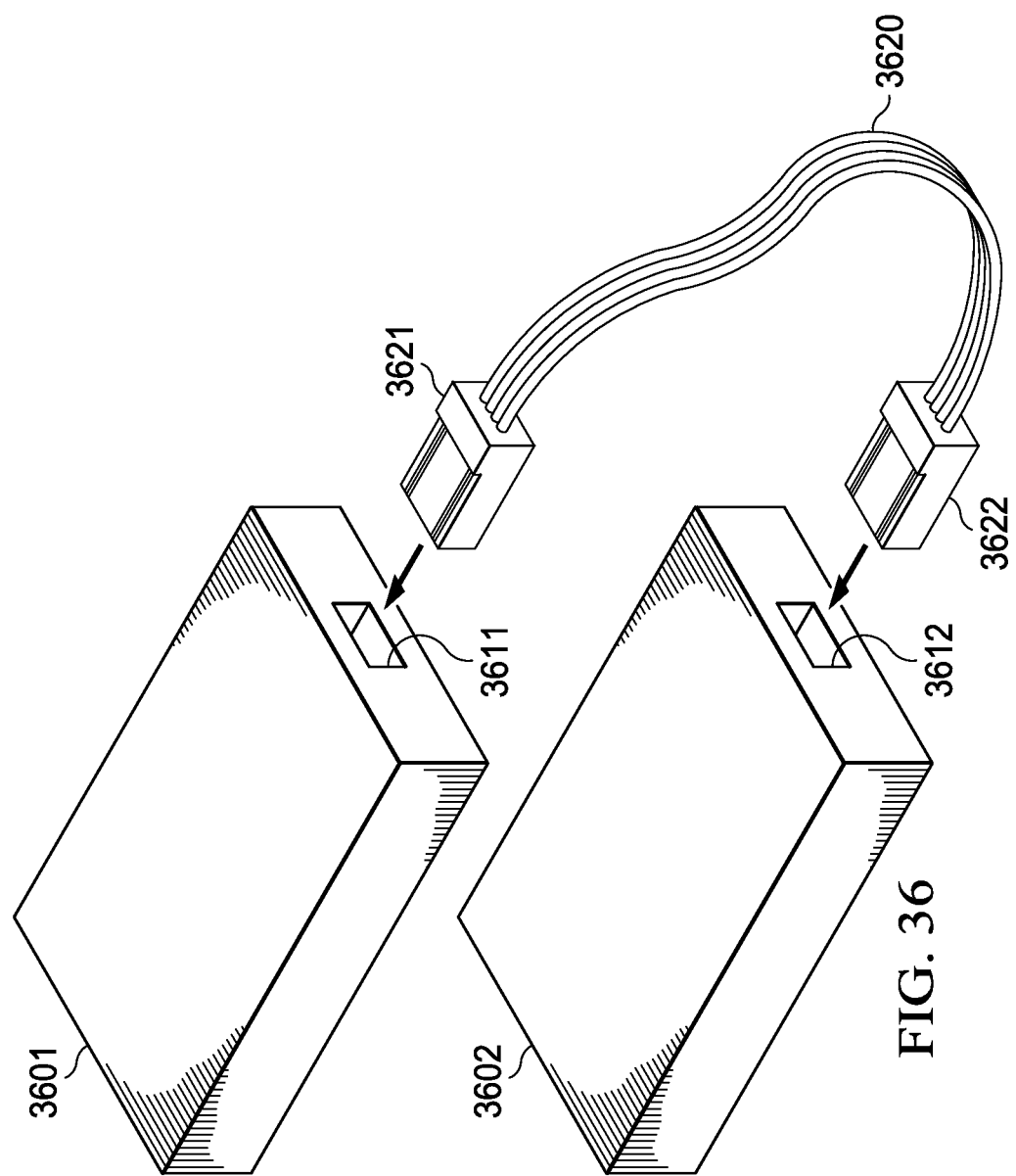
FIG. 36 is an illustration of two systems being interconnected with a DWG.

FIG. 36 is an illustration of two systems 3601, 3602 being interconnected with a DWG 3620. The two systems may be a computing device and a peripheral device or two computing devices that a user is connecting together for personal or business use, for example. The systems may be any form of computing device, such as, but not limited to: a rack mount, desk mount, or portable computer, a mobile user device such a notebook computer, a tablet computer, a smart phone, etc, for example. The systems may be any type of peripheral device such as: a media storage device such as rotating or solid state disk drive, a modem or other interface to a high speed network, etc, for example.

DWG 3620 may be any form of flexible of rigid DWG as described in more detail above, for example. The DWG may be a combination cable as described above, such as an enhanced USB cable that includes a DWG, for example. The connection may use an RJ45 connector as described in more detail above. There may be a single DWG, or there may be multiple DWGs, depending on the requirements of the systems.

Connectors 3621 and 3622 may be inserted into matching receptacles 3611, 3612 by a user or system integrator. The connectors and receptacles may be RJ45 style connectors, as described above with reference to FIGS. 32-34, or any other type of connector that provides alignment for DWG 3620.

Each system 3601, 3602 may contain a PWB or other type substrate on which are mounted one or more integrated circuits as described above in more detail that produce or receive a sub-terahertz signal that is coupled to a DWG that is then terminated in receptacles 3611, 3612. The manner of coupling between the IC and the DWG may be implemented using any of the techniques described above in more detail, for example.

As shown by the above descriptions and examples, two or more electronic devices may be easily interconnected to provide sub-terahertz communication paths between the electronic devices by using the techniques described herein.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, several of the techniques described herein may be combined in various manners. For example, the various mating interface configurations described with reference to FIGS. 11-15 may be applied to the output end of any of the DWG segments described with reference to FIGS. 2A-2D, 5, 8A, 21A-21D, 22-27, 29, and 32, etc, for example. The connectors described in FIGS. 15, 32 and 33 may be applied to any of the DWG segments described herein. Various ones of the DWGs described herein may be coupled to any of the various launching structures described herein. Multiple launching structures may be used for DWG cables that have multiple core members, as described herein. Other combinations not explicitly recited here may be made.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A dielectric waveguide (DWG) comprising:
   a longitudinal dielectric core member, wherein the core member has a first dielectric constant value; and
   a cladding surrounding the dielectric core member, wherein the cladding has a second dielectric constant value that is lower than the first dielectric constant; and
   wherein a portion of the DWG is configured as a corner having a radius; and further comprising a conductive layer formed on an outer radius of the corner;
   wherein the conductive layer is formed on only the outside radius of the portion of the DWG configured as the corner.

2. A system comprising:
   a first substrate;
   an electronic device mounted on the first substrate, the electronic device having radio frequency (RF) circuitry for processing a radio frequency signal;
   a launching structure coupled to the RF circuitry; and
   a dielectric wave guide (DWG) mounted on the first substrate with a first end interfaced to the launching structure, the DWG comprising:
   a longitudinal dielectric core member, wherein the core member has a first dielectric constant value; and
   a cladding surrounding the dielectric core member, wherein the cladding has a second dielectric constant value that is lower than the first dielectric constant; and
   wherein a portion of the DWG is configured as a corner having a radius; and further comprising a conductive layer formed on an outer radius of the corner;
   wherein the conductive layer is formed on only the outside radius of the portion of the DWG configured as the corner.

* * * * *